(12) United States Patent
Wang

(10) Patent No.: US 7,124,388 B2
(45) Date of Patent: Oct. 17, 2006

(54) METHODS TO GENERATE STATE SPACE MODELS BY CLOSED FORMS AND TRANSFER FUNCTIONS BY RECURSIVE ALGORITHMS FOR RC INTERCONNECT AND TRANSMISSION LINE AND THEIR MODEL REDUCTION AND SIMULATIONS

(76) Inventor: Sheng-Guo Wang, 2516 Radrick Ln., Charlotte, NC (US) 28262-4443

( * ) Notice: Subject to any disclaimer, the term of this patent is extended or adjusted under 35 U.S.C. 154(b) by 118 days.

(21) Appl. No.: 11/037,701

(22) Filed: Jan. 18, 2005

(65) Prior Publication Data
US 2005/0160382 A1    Jul. 21, 2005

Related U.S. Application Data

(60) Provisional application No. 60/537,406, filed on Jan. 20, 2004.

(51) Int. Cl.
*G06F 17/50* (2006.01)
(52) U.S. Cl. ............... 716/10; 716/1; 716/6; 703/14
(58) Field of Classification Search ............... 716/1, 716/2, 6, 10; 703/14
See application file for complete search history.

(56) References Cited

U.S. PATENT DOCUMENTS 6,460,165 B1 * 10/2002 Ismail et al. ............... 716/1

* cited by examiner

*Primary Examiner*—Thuan Do

(57) ABSTRACT

There is provided a set of methods with the exact accuracy to effectively calculate the n-th order state space models of RC distributed interconnect and transmission line in closed forms in time domain and transfer functions by recursive algorithms in frequency domain, where their RC components can be evenly distributed or variously valued. The main features include simplicity and accuracy of the said closed forms of the state space models $\{A,B,C,D\}$ without involving matrix inverse and matrix multiplication operations, effectiveness and accuracy of the said recursive algorithms of the transfer functions, dramatic reduction of the calculation complexity to $O(n)$ for the state space models, simulation methodology, and practice of various model reductions and their optimization. For evenly distributed RC interconnect and transmission line, the said closed form of state space model has its computation complexity of only a fixed constant, i.e., $O(1)$.

25 Claims, 9 Drawing Sheets

An RC interconnect and transmission line model with source and load (Model 1)

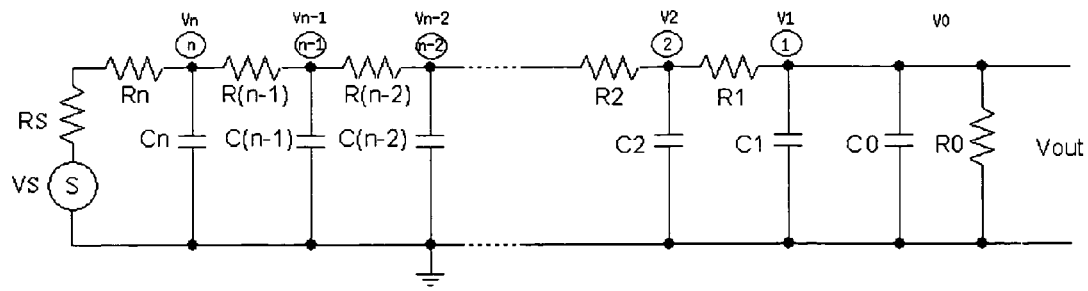
Fig. 1. An RC interconnect and transmission line model with source and load (Model 1)
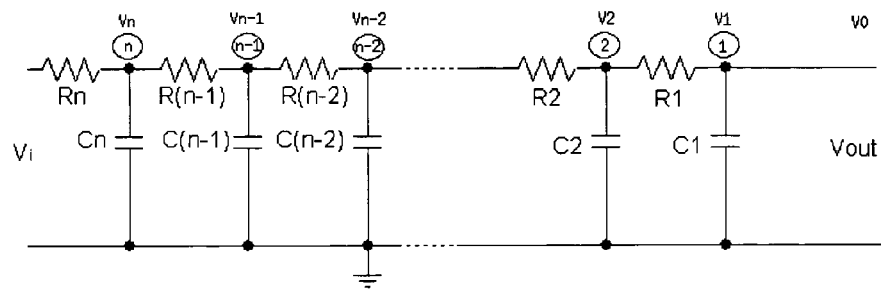
Fig. 2 An RC interconnect and transmission line model (Model 2)
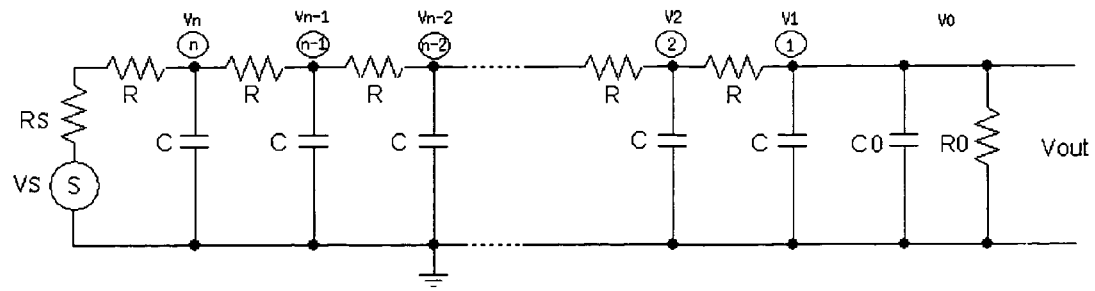
Fig. 3 An even RC interconnect and transmission line model with source and load (Model 3)

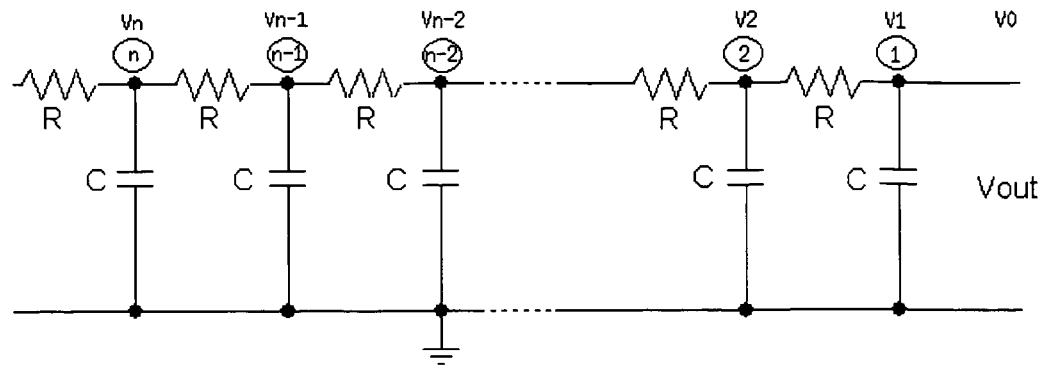
Fig. 4. An even RC interconnect and transmission line model (Model 4)
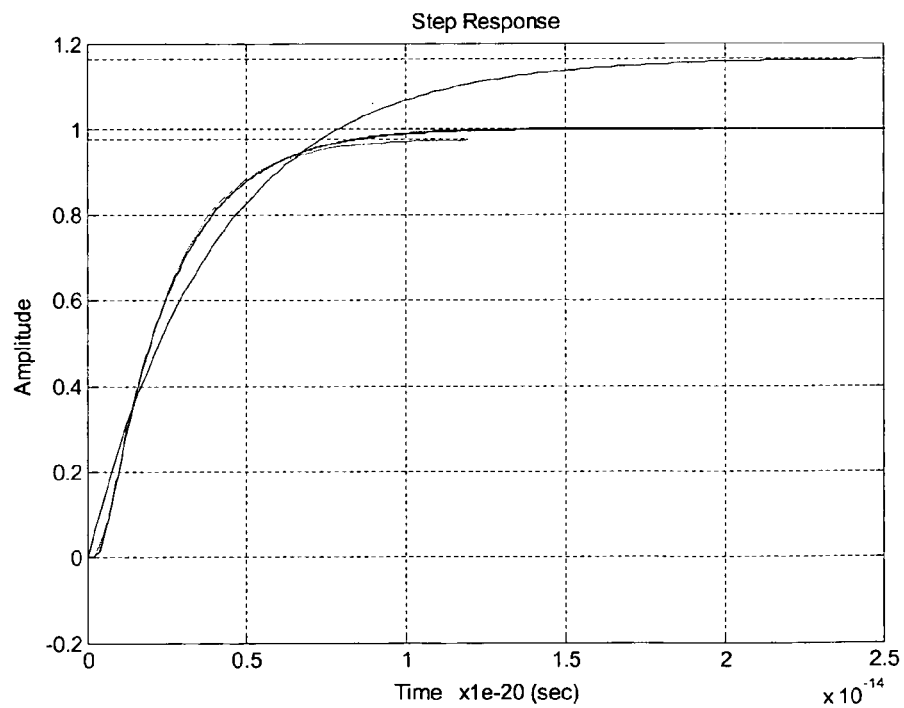
Fig.5. Step Responses of an Original Model and its BTM Reduced Order Models in Model 4

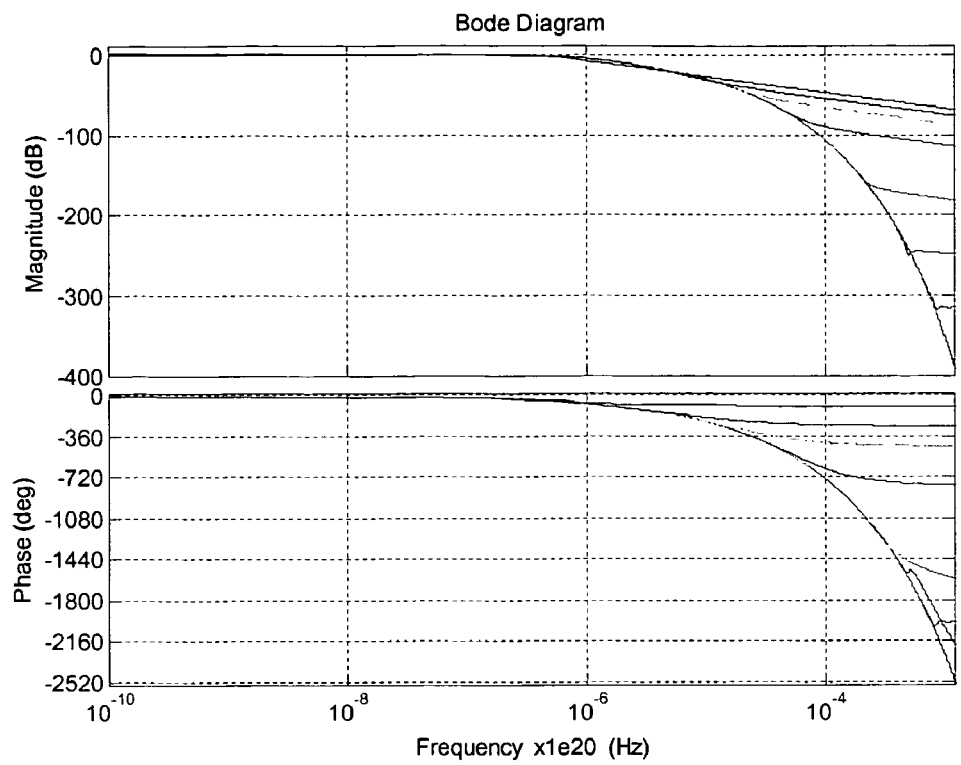
Fig.6. Bode Plots of the Original Model and its BTMs in Model 4
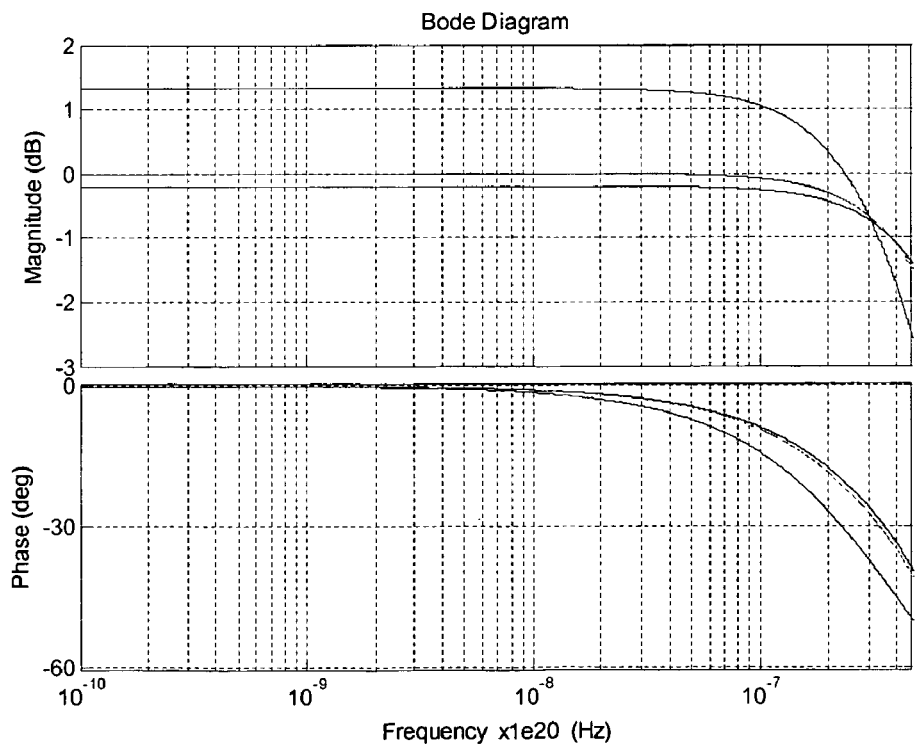
Fig.7. Bode Plots of an Original Model and its BTMs in Low $f$ Range in Model 4

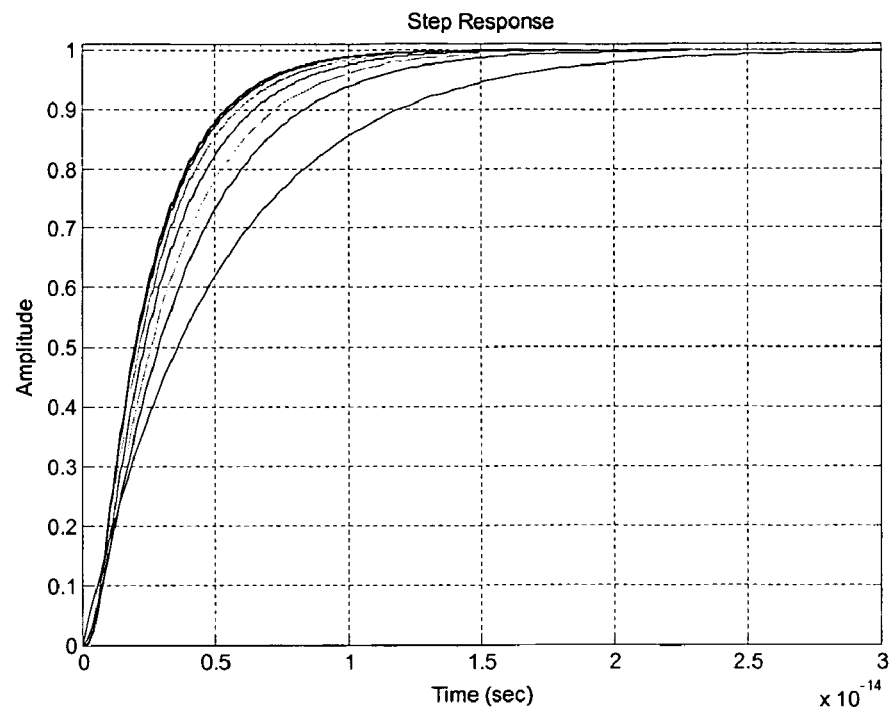
Fig. 8. Step Responses of an Original Model and its ELO Reduction models in Case 1
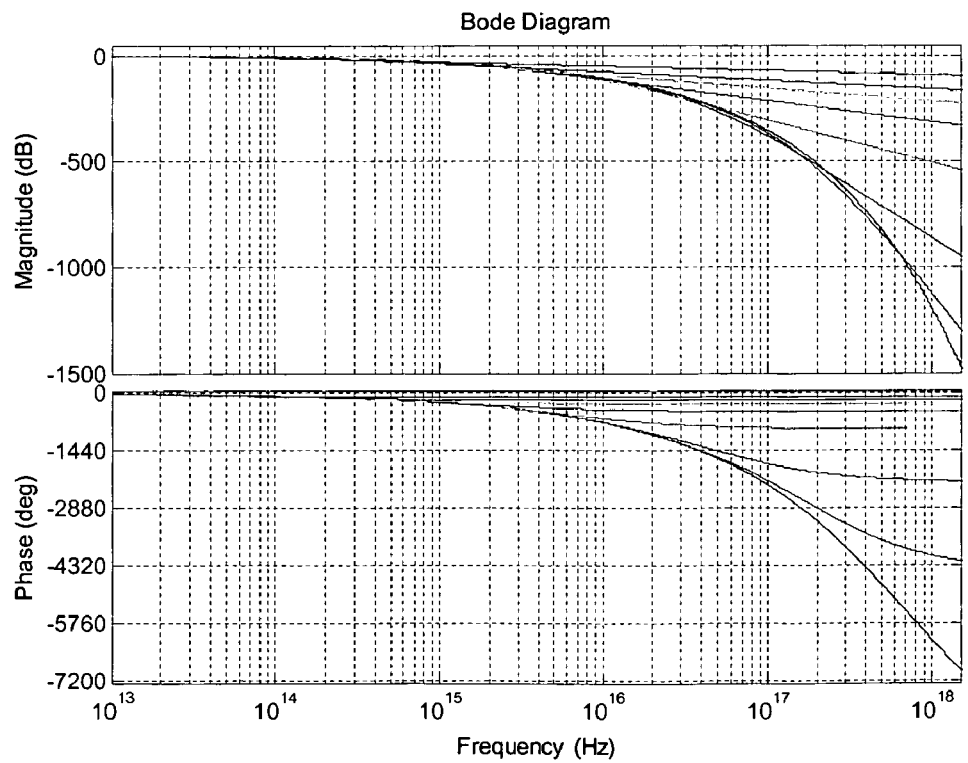
Fig.9. Bode Plots and Discord Frequencies of an Original Model and its ELO models

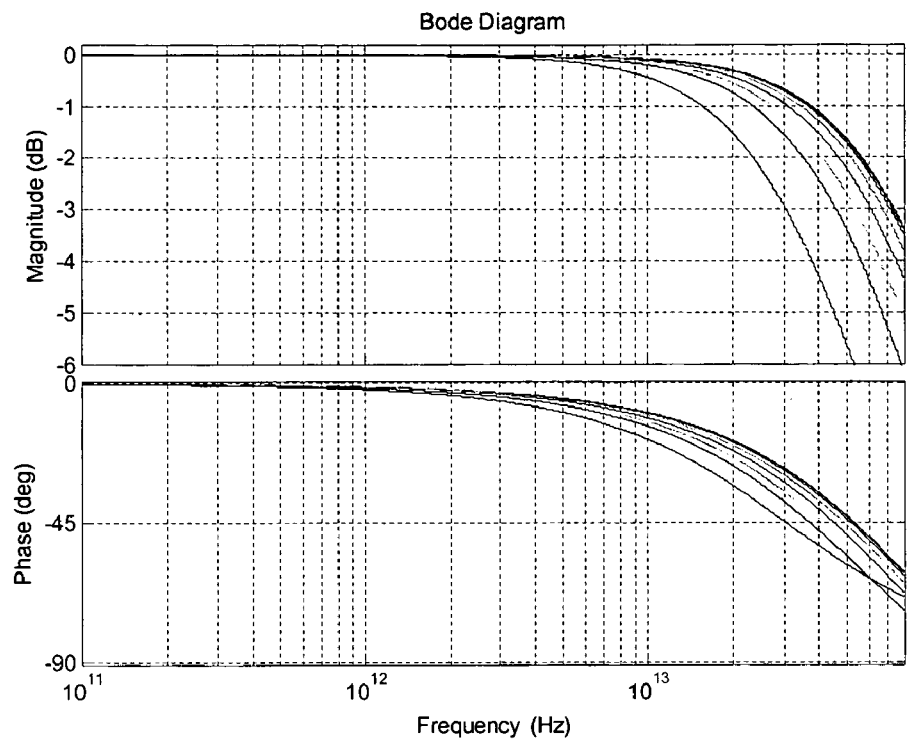
Fig.10. Bode Plots and Bandwidths of an Original Model and its ELO Models
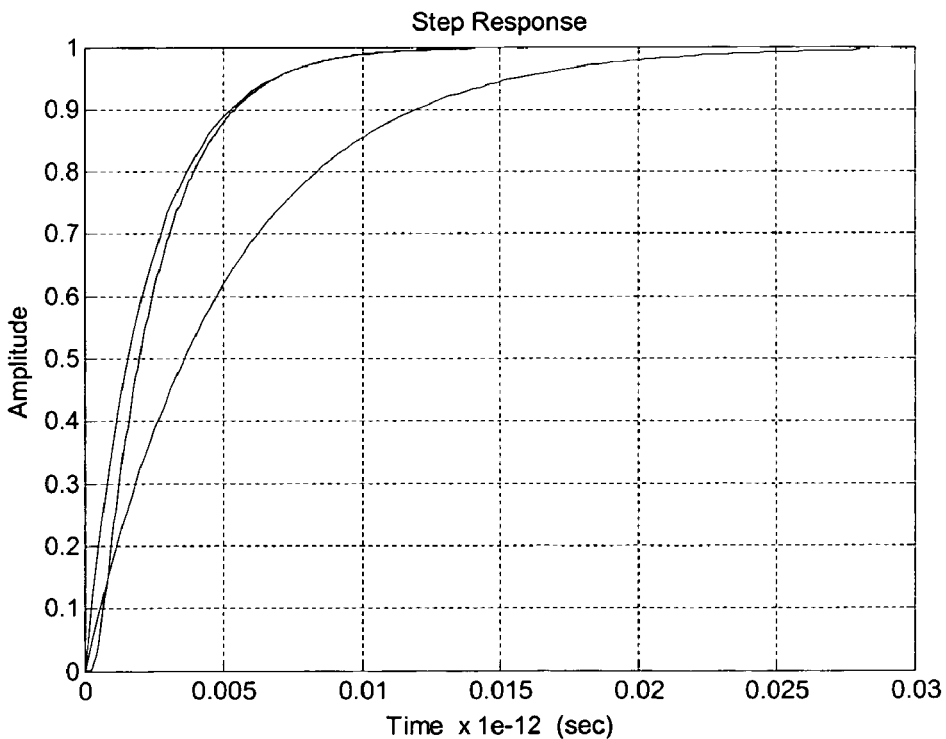
Fig.11. Step Responses of Original Model and 1$^{st}$ Order ELO Models before and after Optimization

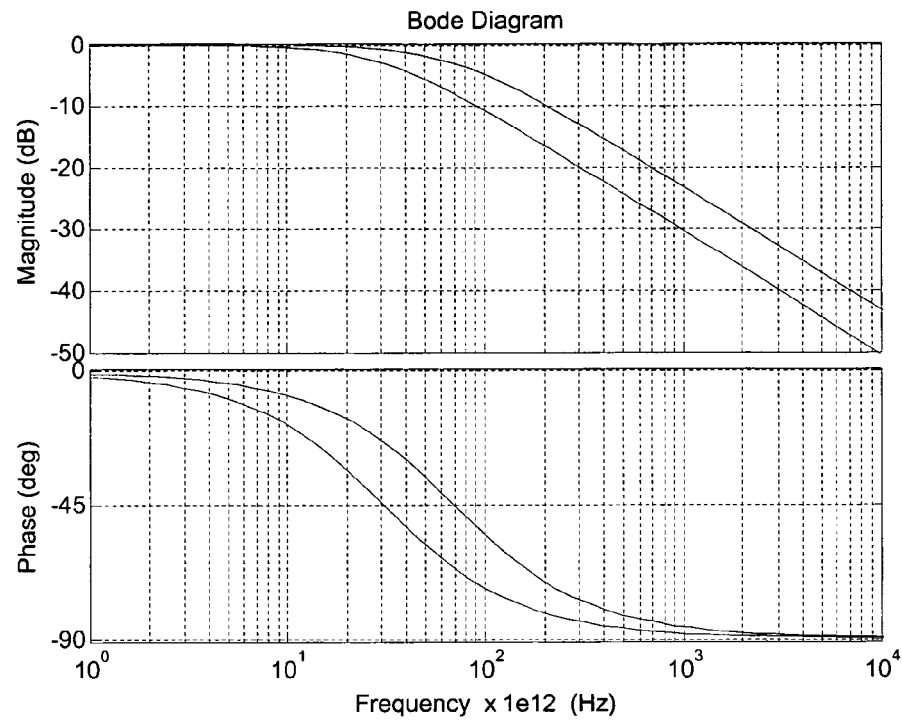
Fig. 12. Bode Plots of Original Model and 1st Order ELO Models before and after Optimization
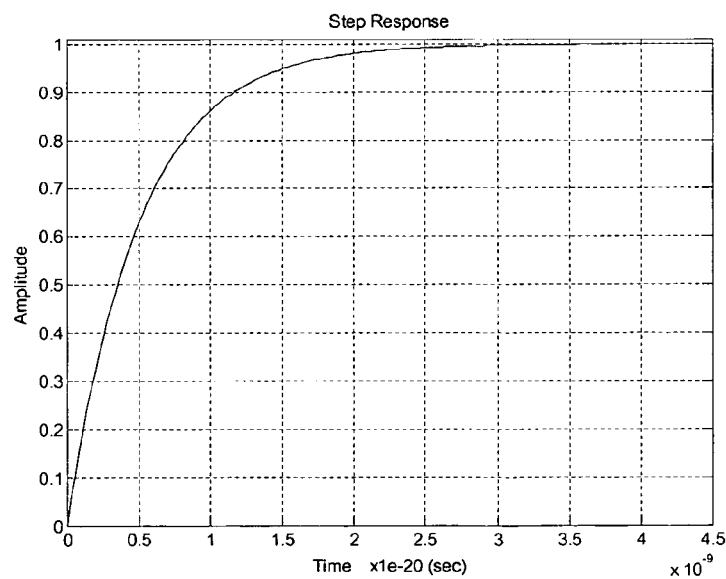
Fig.13. Step Responses of the Even Distributed Interconnect in Model 3 and its BTM Models

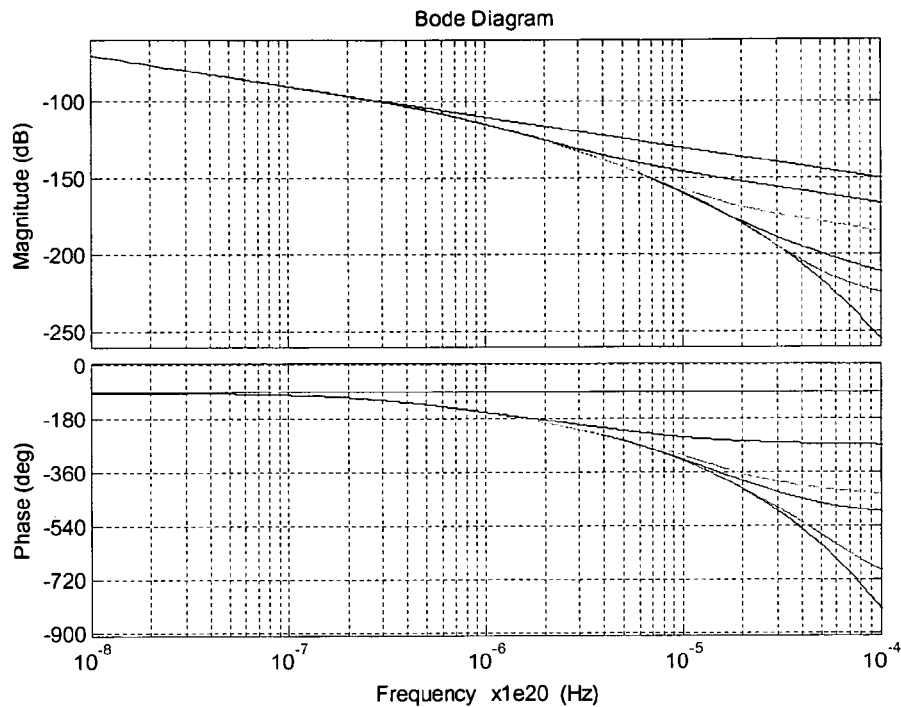
Fig.14. Bode Plots and Discord Frequencies of Interconnect and its BTM Models in Model 3
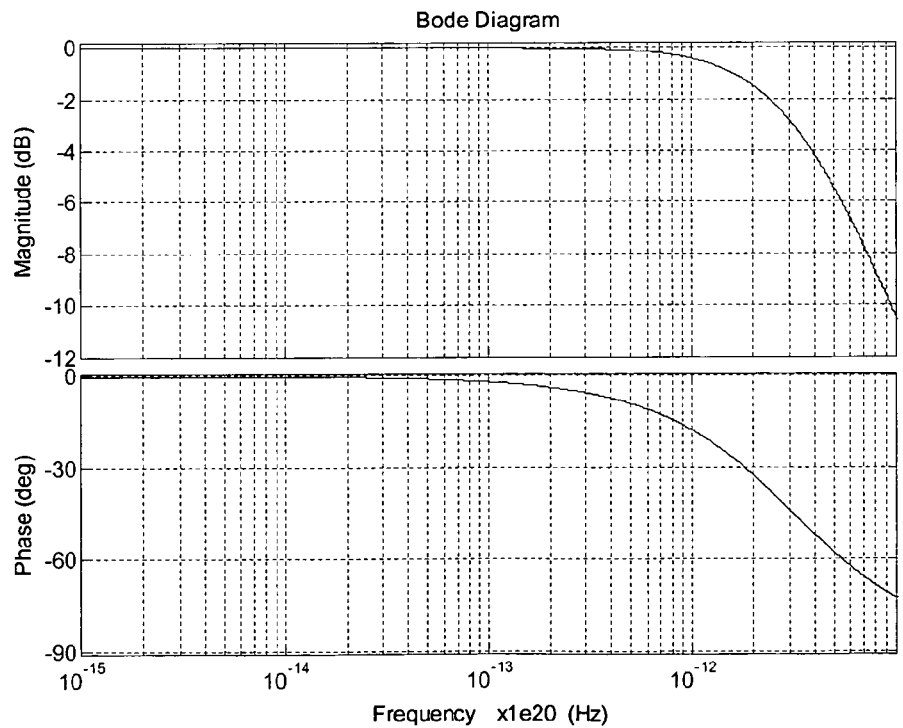
Fig.15. Bode Plots of an Interconnect and its BTM Models in Model 3 upto $10^9$ Hz

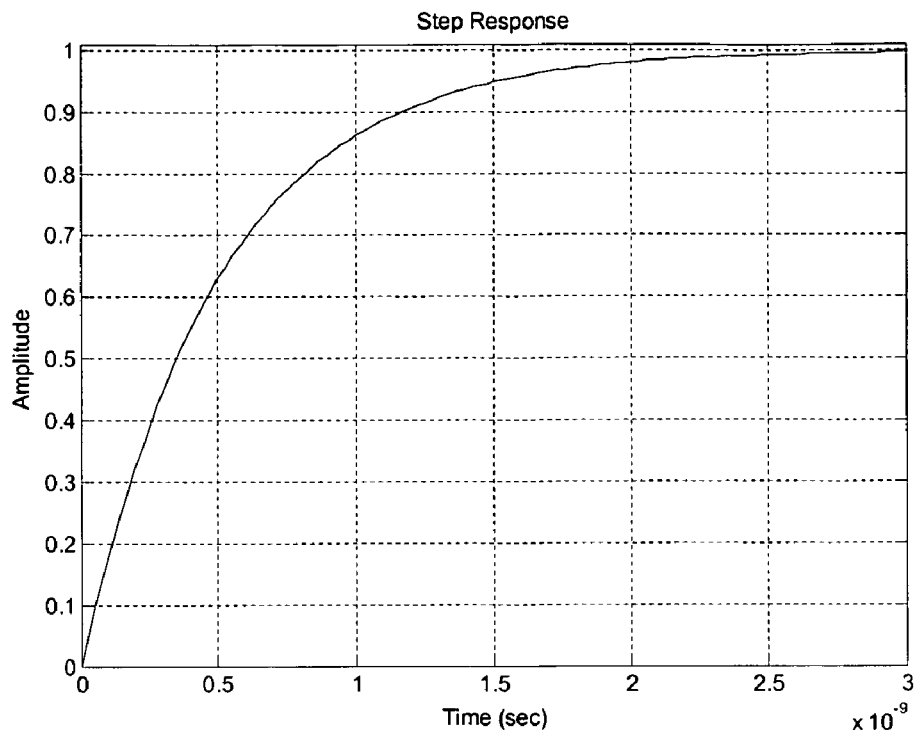
Fig.16. Step Responses of an Interconnect and its ELO models in Model 3
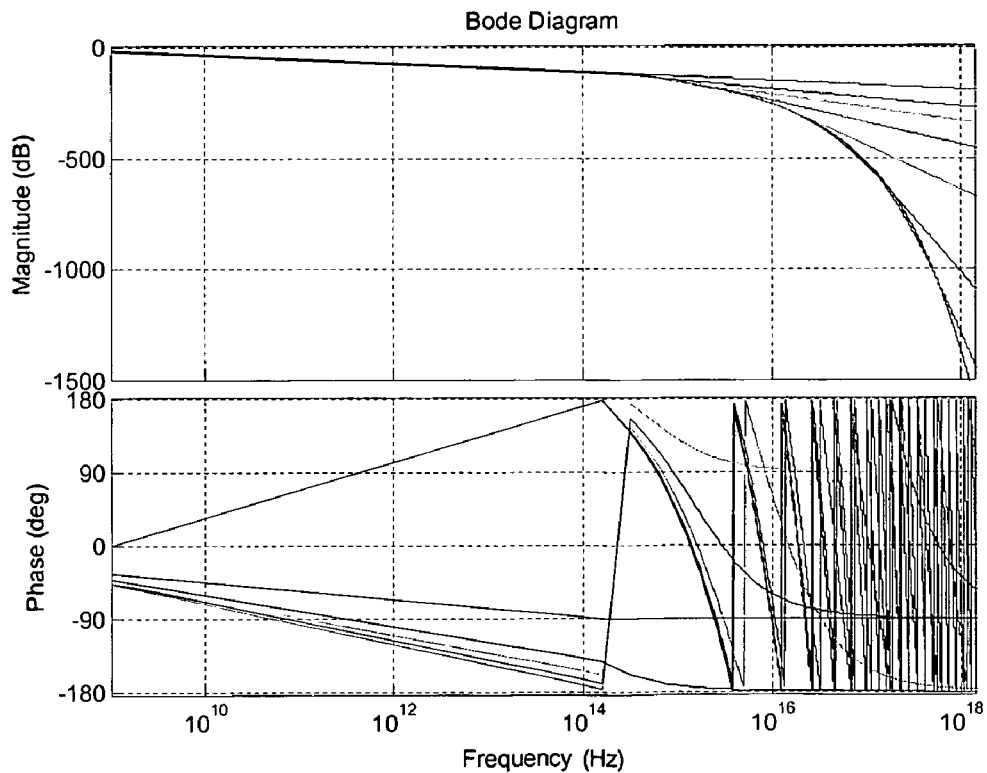
Fig.17. Bode Plots of an Interconnect and its ELO Models in Model 3

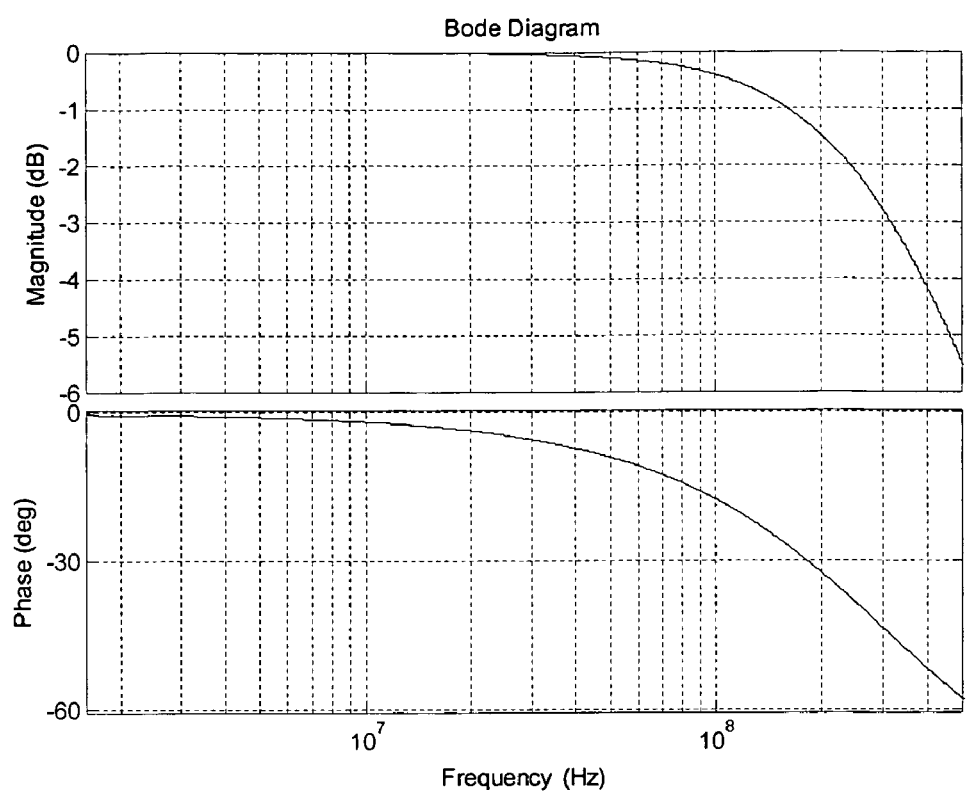
Fig.18. Bode Plots and Bandwidths of an Interconnect and its ELO Models in Model 3

METHODS TO GENERATE STATE SPACE MODELS BY CLOSED FORMS AND TRANSFER FUNCTIONS BY RECURSIVE ALGORITHMS FOR RC INTERCONNECT AND TRANSMISSION LINE AND THEIR MODEL REDUCTION AND SIMULATIONS

This application claims the benefit of U.S. Provisional Application No. 60/537,406 filed Jan. 20, 2004, and entitled as the above.

STATEMENT REGARDING FEDERALLY SPONSORED RESEARCH OR DEVELOPMENT

This invention was made with Government support under the NSF CCR 0098275 awarded by the National Science Foundation. The Government has certain rights in this invention.

CROSS-REFERENCE TO RELATED APPLICATIONS

No Related Nonprovisional Application

REFERENCE TO SEQUENCE LISTING, A TABLE, OR A COMPUTER PROGRAM LISTING COMPACT DISK APPENDIX

Not Applicable

BACKGROUND OF THE INVENTION

1. Field of the Invention

The present invention relates to RC interconnect and transmission line, and methods to obtain their state space model in time domain and transfer function in frequency domain, and their simulations for their characteristics and evolution, and their practice for various model reduction methods.

2. Description of the Related Art

Over times, VLSI has become larger with more and smaller transistors per square centimeter. With the rapid increase of integration level and speed, IC interconnect becomes one of the important limiting factors of today's VLSI circuit design performance. It has become well accepted that interconnect delay dominates gate delay in current deep submicrometer VLSI circuits. With the continuous scaling of technology and increased die area, especially the chip operation speed increasing, that situation is becoming worse. The average length of the chip interconnect and the chip area occupied by interconnect are both increasing. The advance of high-speed deep-submicron VLSI technology requires chip interconnect and packaging to be modeled by distributed circuits [Reed and Rohrer 1999, Wang et al. 2002]. Such a detailed modeling level eventually results in large scale linear RLC or RC circuits to be analyzed. In transmission line area, it is also well know that the transmission line should be modeled as distributed circuits, resulting in large scale linear RLC or RC circuits.

In circuit design, fast and accurate computer simulation of the behavior of the circuit is important. That is especially true with VLSI, in which hundreds of thousands of circuit elements can be placed on a single chip, and with ULSI, in which millions of circuit elements can be placed on a single chip.

The increasing size of integrated systems creates an explosion in interconnect modeling complexity of unmanageable proportions. As the interconnect complexity gradually increases, its electrical design becomes more challenging. An effort of reducing the circuit order (or size) is then necessary in order to evaluate the circuit performance and characteristics in a reasonable time period, as required by real design practice. The process of reducing linear system order is called linear system order reduction.

In order to design complex circuits properly, accurate characterization of the interconnect behavior and signal transients is required. One interconnect in a VLSI circuit is commonly structured in a single line, a tree and a net. However, a single line is a basic component for a tree and a net. Thus, the process of characterizing signal waveforms in a single line structured interconnect is of primary basis and importance.

There are various model reduction methods, such as Elmore delay model, AWE (Asymptotic Waveform Evaluation) for timing analysis, PVL (Padé approximation via Lanczos approach), Klyrov space decomposition, Klyrov-Arnoldi-based reduced-order modeling, BTM (Balance Truncation Method), and old traditional even length-division order (ELO) modeling.

However, almost all model reduction methods in the state space need to start from an accurate state space high order models of interconnect and transmission line in order to result in a good model reduction, such as Klyrov space method, BTM, ELO, PVL and Arnoldi-based method needs state space system matrix A and input matrix B in state space. On the other hand, model reduction methods in frequency domain via the transfer function need either to start from the above state space model or its accurate transfer function model, such as Elmore model and AWE and ELO.

The original accurate models in state space equation and transfer function are important not only as a basis of an accurate starting point for all various model reduction methods, but also as a basis of performance comparison for checking the approximation of all various model reduction methods.

It is noticed that to get an accurate state space model for the starting point has significantly high computational complexity as shown as follows, in addition to the high computation complexity of model reduction techniques themselves. It is well known that an RC and an RLC interconnect and transmission line can be described as the following differential equation in matrix form based on the KCL or KVL:

$$Gx(t) + C_{LC}\frac{dx(t)}{dt} = bu(t) \quad (1)$$

where G and $C_{LC}$ are parameter matrices related to the parameters of resisters, capacitors and inductors of the interconnect and transmission line and the structure of the line, tree and net, u(t) is the input source vector and x(t) is a vector of the node voltages and inductor currents or the node voltage derivatives. The state space model {A,B,C,D} of an RC interconnect and transmission line is in $$\dot{x}(t)=Ax(t)+Bu(t), y(t)=Cx(t)+Du(t), \quad (2)$$

where the state variable $x(t) \in R^n$, input variable $u(t) \in R$ and output variable $y(t) \in R$, and the order n is the number of capacitors in the circuit (a line, tree or net). Thus, it is apparent from equation (1) that the calculation of inverse of matrix $C_{LC}$ and multiplication of $C_{LC}^{-1}$ with matrix G and vector b are necessary to get matrix A and matrix B in the state space model. From the well known results, the computation complexity of only matrix inverse is $O(n^2) \sim O(n^3)$ depending on the matrix structure and the inverse algorithm, and the computation complexity of n×n matrix multiplication is also $O(n^3)$ usually. For very high order system, the matrix inverse calculation leads to calculation singularity problem due to bad condition number of the matrix, making a calculation problem. Note that n should be as large as we can for approaching to a distributed model, and on the other hand, it can be in the order of thousands for a typical large industrial net.

To avoid this difficulty, it is usual to take a suitable small or middle size of order for the original model of distributed RC and RLC interconnect and transmission line by using even length division with its parameters proportional to their length.

It is noticed that the limited number of orders or poles is inappropriate to evaluate the transient response at the nodes of underdamped RLC interconnect and transmission line, which require a much higher order model to accurately capture the transient response. However, highly accurate estimation of signal transients within a VLSI circuit is required for performance-critical modules and nets and to accurately anticipate possible hazards during switching. Also, the increasing performance requirements forces the reduction of the safety margins used in a worst case design, requiring a more accurate delay characterization.

An exact original high order model is much important not only as a starting point for all model reduction methods, but also as an evaluation criterion for all reduced order models. In that an exact original model of a single line interconnect and a transmission line is primary important because it is a basic structure of interconnect and transmission line, but also a basic element to build a tree structure and a net structure of interconnect and transmission lines. However, due to very large size of the original interconnect model, an important and difficult aspect is how to have a method to get its original model in a suitable time and cost-less calculation time. It should be and has to be an exact accurate model of such large order. It not only provides an accurate starting point for model reduction, but also is a basis for checking and evaluating of reduced model performance.

Furthermore, when uncertainties are considered, to investigate robustness of the performance of the VLSI including interconnects needs a through and careful knowledge of interconnects, i.e., its accurate model.

The way to find this distributed linear model usually is from the s-domain by Kirchhoff's law and algebraic equations or from the time domain by Kirchhoff's law and differential equations. However, it is bound to meet calculation of so-high dimension matrix inverse in conventional methods. Due to the distributed interconnect characteristics, the size is very large, e.g., a $10^{6 \times 10^6}$ matrix, it is desired to have an elegant closed-form of the state space model and an effective recursive algorithm of the transfer function model for the RC and RLC distributed interconnects and transmission lines to dramatically reduce the calculation complexity. Moreover, simulations based on these models can be developed to capture the transient response in exact or arbitrary accuracy.

It is noticed that there exists some kind of simple algorithms in finding transfer function of interconnect and transmission line. However, it is only an approximation to exact transfer function due to no consideration of load effect or under an assumption of no load effect. One simple example of two-section RC interconnect shows the approximation error. The simple rough method takes a multiplication of each individual section transfer function and leads to a transfer function as $$T_{12}(s) = \frac{1}{1+R_1C_1s} \cdot \frac{1}{1+R_2C_2s} = \frac{1}{R_1C_1R_2C_2s^2 + (R_1C_1+R_2C_2)s+1} \quad (3)$$

$$= \frac{1/(R_1C_1R_2C_2)}{s^2 + \left(\frac{1}{R_1C_1} + \frac{1}{R_2C_2}\right)s + \frac{1}{R_1C_1R_2C_2}}.$$

However, the exact transfer function of this two-section RC is $$T_{12}(s) = \frac{1}{R_1C_1R_2C_2s^2 + (R_1C_1+R_2C_1+R_2C_2)s+1} \quad (4)$$

$$= \frac{1/(R_1C_1R_2C_2)}{s^2 + \left(\frac{1}{R_1C_1} + \frac{1}{R_2C_2} + \frac{1}{R_1C_2}\right)s + \frac{1}{R_1C_1R_2C_2}}$$

It is obvious to see the difference of equation (4) from equation (3).

Notice that the disclosed recursive algorithm requires a recursive algorithm involving two steps back data. This method and algorithm exactly recover the exact transfer function in a so effective way in both systematic elegance and calculation complexity. Thus, this fact implies that all one step back recursive algorithms are either not correct for an exact transfer function derivation if no load effect adjustment, or not efficient in computation complexity for derivation of the exact transfer function.

In all, current conventional methods are lack of an elegant way to get exact original high order state space model and effective recursive transfer function of distributed interconnect and transmission line.

SUMMARY OF THE INVENTION

In light of the above, it will be apparent that a need exists in the art for RC interconnect and transmission line circuit model and its analysis method and system which can accurately capture the original model and the transient responses at all nodes in a computationally efficient manner.

It is therefore a primary object of the invention to provide a method and system for establishing an exact accurate state space model by an efficient closed form in time domain and an exact accurate transfer function model by an efficient recursive algorithm in frequency domain for RC interconnect and transmission line.

It is another objective of the invention to provide the said exact models as a basis for evaluating the transient response of an RC interconnect and transmission line using various existing model reduction/approximation methods and the herein developed methods.

It is another objective of the invention to provide a method and a system and a base for searching a simple model reduction and/or an optimized model reduction of an RC interconnect and transmission line using the above said exact accurate models together with various model reduction methods.

It is another object of the invention to provide such said methods and systems which can do so in a computationally efficient manner.

It is yet another object of the invention to provide such a method and system of the model reduction having a high degree of stability in terms of both numerical stability and pole stability and physical synthesizable.

In short, it is a key objective of this present invention to provide exact accurate n-th order models and their simple algorithms of RC interconnect and transmission line by the said closed form of the state space model in time domain and the said recursive algorithm of the transfer function model in frequency domain. The main features include the exact accuracy of the models and high efficiency of the algorithms.

To achieve the above and other objects, the present invention is directed to a method and system for establishing the exact accuracy original models of the RC interconnect and transmission line in both time domain and frequency domain in a computationally efficient way (O(n) complexity, i.e., linear with n). For evenly distributed RC interconnect and transmission line, the said closed form of state space model has its computation complexity of only a fixed constant, i.e., O(1). The present invention also has guaranteed stability properties for low order approximations as compared to AWE, which can be a useful feature with RC interconnect and transmission lines which do not require high order approximations.

The method and system to establish the original n-th order models operate as follows. The order of the distributed circuits is assumed as n as general. Thus, the RC interconnect and/or transmission line has n-th pieces as shown in FIG. 1, each having a resistor between two neighbor nodes and a capacitor from the node to the ground. The input port is with a source voltage $v_{in}(t)$ and the output port is then with a voltage $v_o(t)$. Their distributed resistances are denoted as $R_i$, $i=1, \ldots, n$, and the distributed capacitors are denoted as $C_i$, $i=1, \ldots, n$. The subscripts are ordered from the output terminal to the input terminal, different from the normal way from the input terminal to the output terminal. The nodes and their voltages are also numbered in this way as node i and its voltage $v_i(t)$, $i=1, \ldots, n$. The advantage of this treatment will be shown in the following when the recursive algorithm is developed. It provides an insight into the general format of the model. This general interconnect/transmission line has a source resistor $R_s$ and a load resistor $R_0$ and a load capacitor $C_0$. We call this Circuit Model 1 in FIG. 1.

Consider Circuit Model 1 and take the state variable vector x(t), the input variable u(t) and the output variable y(t) as $$x(t)=[v_n(t),v_{n-1}(t),\ldots,v_1(t)]^T, u,(t)=v_{in}(t), \text{ and } y(t)=v_o(t)=v_1(t) \quad (5)$$

respectively, where the state variable $x(t)\epsilon R^n$, the input variable $u(t)\epsilon R$ and the output variable $y(t)\epsilon R$ for the considered distributed interconnect circuit. Then, its spate space model {A,B,C,D} of the distributed RC circuit in FIG. 1 is as follows:

$$\dot{x}(t) = Ax(t) + Bu(t) \text{ and } y(t) = Cx(t) + Du(t) \quad (6)$$

$$A = \begin{bmatrix} -\frac{1}{C_n}\left(\frac{1}{R_s+R_n}+\frac{1}{R_{n-1}}\right) & \frac{1}{C_n R_{n-1}} & 0 & \cdots & \cdots & 0 & 0 \\ \frac{1}{C_{n-1}R_{n-1}} & -\frac{1}{C_{n-1}}\left(\frac{1}{R_{n-1}}+\frac{1}{R_{n-2}}\right) & \frac{1}{C_{n-1}R_{n-2}} & \cdots & 0 & 0 & 0 \\ 0 & \frac{1}{C_{n-2}R_{n-2}} & \ddots & \ddots & 0 & 0 & 0 \\ \vdots & \vdots & \ddots & \ddots & \ddots & \vdots & \vdots \\ \vdots & \vdots & \cdots & \ddots & \ddots & \frac{1}{C_3 R_2} & 0 \\ 0 & 0 & \cdots & \cdots & \frac{1}{C_2 R_2} & -\frac{1}{C_2}\left(\frac{1}{R_2}+\frac{1}{R_1}\right) & \frac{1}{C_2 R_1} \\ 0 & 0 & \cdots & \cdots & 0 & \frac{1}{(C_1+C_0)R_1} & -\frac{1}{C_1+C_0}\left(\frac{1}{R_1}+\frac{1}{R_0}\right) \end{bmatrix},$$

$$B = \begin{bmatrix} \frac{1}{(R_s+R_n)C_n} \\ 0 \\ \vdots \\ 0 \end{bmatrix}, \quad C = [0 \ \ldots \ 0 \ 1] \text{ and } D = 0 \quad (7)$$

It is a closed form of the exact space state model for the n-th order distributed interconnect and transmission line of Model 1 in FIG. 1, where n>>1 usual. However, it is also valid for any n>1.

For a special case n=1, the above model is reduced and will be described in late section. It usually relates to the model reduction, while the distributed interconnect characters are captured by a very large order n.

Then the method to establish the state space model is as follows:

Method SS1 (state space model 1):

i) Set order n.

ii) Set the state matrix A as (7)

First let matrix A be a n by n zero matrix, then set $$a_{11} = -\frac{1}{C_n}\left(\frac{1}{R_s+R_n}+\frac{1}{R_{n-1}}\right), a_{nn} = -\frac{1}{C_1+C_0}\left(\frac{1}{R_1}+\frac{1}{R_0}\right), n \geq 2 \quad (8)$$

$$a_{1i} = -\frac{1}{C_{n-i+1}}\left(\frac{1}{R_{n-i+1}}+\frac{1}{R_{n-i}}\right), i = 2, \ldots, n-1, n > 2$$

$$a_{1,i+1} = \frac{1}{C_{n-i+1}R_{n-i}}, i = 1, \ldots, n-1, n \geq 2. \quad (9)$$

$$a_{i,i-1} = \frac{1}{C_{n-i+1}R_{n-i-1}}, i = 2, \ldots, n-1, \text{ and} \quad (10)$$

-continued $$a_{n,n-1} = \frac{1}{(C_1 + C_0)R_1}, n \geq 2. \quad (11)$$

iii) Set the input matrix B, an n×1 column vector as (12)

$$b_1 = \frac{1}{(R_s + R_n)C_n}, b_i = 0, i = 2, \ldots, n. \quad (12)$$

iv) Set the output matrix C, an 1×n row vector as (13)

(a) $c_i$=0, i=1, ..., n, (b) $c_j$=1, j∈I[1,n]; usually j=n, (13)

to select node n−j+1 as the output node for checking this node voltage.

v) Set the direct output scalar D=0.

vi) Thus, the state space model {A,B,C,D} is established for Model 1.

Another common model to describe a circuit system is its transfer function which specifies the relationship from the input signal vector to the output signal vector in s-domain (frequency domain). The transfer function of the distributed RC interconnect circuit Model 1 in FIG. 1 is derived as follows by an efficient recursive algorithm.

Consider the distributed RC circuit in FIG. 1. Take the corresponding state variable, input and output variables are the same as in (5). Then, the transfer function of the circuit in FIG. 1 from the input $v_{in}(t)$ to the output $v_0(t)$ and its recursive algorithm are follows:

$$T_n(s) = \frac{N_n(s)}{D_n(s)} \quad (14)$$

$$N_n(s) = \frac{1}{C_n(R_s + R_n)} \cdot \frac{1}{1 + C_0/C_1} \prod_{i=1}^{n-1} \frac{1}{C_i R_i} \quad \text{and} \quad (15)$$

$$D_n(s) = \left[s + \frac{1}{C_n}\left(\frac{1}{R_s + R_n} + \frac{1}{R_{n-1}}\right)\right]D_{n-1}(s) - \frac{1}{C_n R_{n-1}^2 C_{n-1}} D_{n-2}(s) \quad (16)$$

$$D_j(s) = \left[s + \frac{1}{C_j}\left(\frac{1}{R_j} + \frac{1}{R_{j-1}}\right)\right]D_{j-1}(s) - \frac{1}{C_j R_{j-1}^2 C_{j-1}} D_{j-2}(s), \quad (17)$$

$$j = 2, \ldots, n-1, \text{ in (16)-(17), use } C_1 = C_1 + C_0,$$

with $D_0(s) = 1$, and $D_1(s) = s + \frac{1}{C_1 + C_0}\left(\frac{1}{R_1} + \frac{1}{R_0}\right)$. (18)

as its initial values where n is the order of the circuit system, the transfer function numerator polynomial is $N_n(s)$ and its characteristic polynomial (denominate polynomial) is $D_n(s)$.

Thus, the recursive algorithm for the transfer function from the source voltage signal to the voltage of node 1 (or the same node 0) of Model 1 includes the following steps:

Method TF1 (transfer function model 1):

(i) Set the numerator of the transfer function as (14)

$$N_n(s) = \frac{1}{C_n(R_s + R_n)} \cdot \frac{1}{1 + C_0/C_1} \prod_{i=1}^{n-1} \frac{1}{C_i R_i}; \quad (19)$$

(ii) Set the recursive initiate values with setting $C_1$=$C_1$+$C_0$, $$D_0(s) = 1 \text{ and } D_1(s) = s + \frac{1}{C_1}\left(\frac{1}{R_1} + \frac{1}{R_0}\right); \quad (20)$$

For $j = 2, \ldots, n-1, n > 2$ $$D_j(s) = \left[s + \frac{1}{C_j}\left(\frac{1}{R_j} + \frac{1}{R_{j-1}}\right)\right]D_{j-1}(s) - \frac{1}{C_j R_{j-1}^2 C_{j-1}} D_{j-2}(s), \quad (21)$$

end

Set $D_n(s) = \left[s + \frac{1}{C_n}\left(\frac{1}{R_s + R_n} + \frac{1}{R_{n-1}}\right)\right]D_{n-1}(s) - \frac{1}{C_n R_{n-1}^2 C_{n-1}} D_{n-2}(s); \quad (22)$ (v) Then, the transfer function model is $$T_n(s) = \frac{N_n(s)}{D_n(s)}.$$

The case to consider distributed interconnect and transmission line themselves without the affect of and any distortion by source and load elements (Model 2) in FIG. 2 can be viewed as a special case of Model 1 in FIG. 1 by setting the source resistor and load capacitor to be zero and the load resistor to be infinite as $$R_s = 0, C_0 = 0, \text{ and } \frac{1}{R_0} = 0. \quad (23)$$

Another special case is that a considered interconnect and/or transmission line of Model 1 in FIG. 1 is an even distributed interconnect and/or transmission line (Model 3) in FIG. 3. In this case, all piece resistors and capacitors are respectively the same as $R_i$=R and $C_i$=C, i=1, ..., n. (24)

They are related to the parasitic parameters of the interconnect and transmission line as $R=R_t$/n and $C=C_t$/n (25)

where parasitic resistor $R_t$ and capacitor $C_t$ are the "total" resistor and "total" capacitor of the interconnect, respectively. Here, the quote is used for "total" because it is really distributed, not total.

One further special case (Model 4) is the even distributed interconnect and/or transmission line of Model 3 in FIG. 3 but without the source and load part elements as shown in FIG. 4. Thus, it is also a special case of Model 2 with the special condition of even distribution in (24) and (25).

The corresponding time domain analysis and frequency domain analysis can be easily executed by the derived state space closed-form formulas and transfer functions such as by function command step and bode in MATLAB.

In consideration of model reduction for the interconnect and transmission line, an easy synthesizable and implemented model is proposed here as m-th order corresponding models described above with the best parameters such that the various defined optimal model reduction performance index is minimized. It is preferred to use even distributed m-th order models for simplicity of reduced order models. The above said state space closed-form and transfer function recursive algorithm are used for searching optimal model reduction parameters. Because the reduced models have the same structures as Models 1–4, its synthesizability is obvious by using corresponding low order RC interconnect and transmission line in FIGS. 1–4 but with m-th order, i.e., m sections.

The above said closed forms and transfer functions can be used for analysis of approximation models of the traditional m-th order parasitic RC interconnect and transmission line by even length division in model reduction. We call this tradition m-th order parasitic model as Even Length Order (ELO) reduced model. Thus, the above presented method and algorithm can be used for evaluation of the traditional ELO reduced models.

In one preferred embodiment of the present invention, an RC interconnect and transmission line is just itself, not including its source and load parts, for model reduction without any distortion. Then this reduced order model is connected to its real source and load parts. Thus, this reduced model is not infected and is able to connect to various source and load parts.

Variations of the present invention can include a combination of any partial invention in the present invention and any current conventional method of RC interconnect and transmission line modeling and analysis or any mixture of current conventional method of RC interconnect and transmission line modeling and analysis.

BRIEF DESCRIPTION OF THE DRAWINGS

A preferred embodiment of the present invention will be set forth in detail with reference to the drawings, in which:

FIG. 1 shows a general RC interconnect and transmission line circuit with a source resistor and a load resistor and a load capacitor (Model 1);

FIG. 2 shows a general RC interconnect and transmission line circuit itself (Model 2);

FIG. 3 shows an evenly distributed RC interconnect and transmission line with a source resistor and a load resistor and a load capacitor (Model 3);

FIG. 4 shows an evenly distributed RC interconnect and transmission line itself (Model 4);

FIG. 5 shows the step transient responses evaluated for an example RC interconnect of FIG. 4 (Model 4) and its BTM (Balanced Truncated Model) using different approximation orders;

FIG. 6 shows the Bode plots evaluated for an example RC interconnect of FIG. 4 (Model 4) and its BTM using different approximation orders;

FIG. 7 shows the Bode plots in low frequency range evaluated for an example RC interconnect of FIG. 4 (Model 4) and its BTM using different approximation orders;

FIG. 8 shows the step transient responses evaluated for an example RC interconnect of FIG. 4 (Model 4) and its ELO (Even Length-Order) reduction models using different approximation orders;

FIG. 9 shows the Bode plots evaluated for an example RC interconnect of FIG. 4 (Model 4) and its ELO models using different approximation orders in a wide frequency range;

FIG. 10 shows Bode plots and bandwidths evaluated for an example RC interconnect of FIG. 4 (Model 4) and its ELO models using different approximation orders;

FIG. 11 shows the step transient responses evaluated for an example RC interconnect of FIG. 4 (Model 4) and its regular ELO model and ELO optimization model of order one;

FIG. 12 shows Bode plots evaluated for an example RC interconnect of FIG. 4 (Model 4) and its regular ELO model and ELO optimization model of order one;

FIG. 13 shows the step transient responses evaluated for an example RC interconnect of FIG. 3 (Model 3) and its BTM using different approximation orders;

FIG. 14 shows the Bode plots evaluated for an example RC interconnect of FIG. 3 (Model 3) and its BTM using different approximation orders;

FIG. 15 shows the Bode plots in low frequency range evaluated for an example RC interconnect of FIG. 3 (Model 3) and its BTM using different approximation orders;

FIG. 16 shows the step transient responses evaluated for an example RC interconnect of FIG. 3 (Model 3) and its ELO models using different approximation orders;

FIG. 17 shows Bode plots evaluated for an example RC interconnect of FIG. 3 (Model 3) and its ELO models using different approximation orders; and FIG. 18 shows Bode plots and bandwidths evaluated for an example RC interconnect of FIG. 3 (Model 3) and its ELO models using different approximation orders.

DETAILED DESCRIPTION OF THE PREFERRED EMBODIMENTS

A preferred embodiment of the present invention will now be set forth in detail with reference to the drawings.

The rules governing and the methods finding the state space model parameters in an RC interconnect are defined in the said closed forms in subsection A. The method used to calculate the exact transfer functions at the output node of an RC interconnect and transmission line is introduced in subsection B. Those interconnect and transmission line reduction models are discussed in subsection C. The use of performance evaluation to determine a reduction model approximation is discussed in subsection D. The stability and complexity characteristics of the methods are described in subsection E. Finally experimental results are given in subsection F.

A. Calculating the State Space Models Directly

A. 1. Model 1—with its Source and Load Parts:

One preferred embodiment is Model 1 as shown in FIG. 1 and briefly described in the above summary. It is obvious to see that the state space model in (6) has $$A = \begin{bmatrix} -\frac{1}{C_n}\left(\frac{1}{R_s+R_n}+\frac{1}{R_{n-1}}\right) & \frac{1}{C_nR_{n-1}} & 0 & \cdots & \cdots & 0 & 0 \\ \frac{1}{C_{n-1}R_{n-1}} & -\frac{1}{C_{n-1}}\left(\frac{1}{R_{n-1}}+\frac{1}{R_{n-2}}\right) & \frac{1}{C_{n-1}R_{n-2}} & \cdots & 0 & 0 & 0 \\ 0 & \frac{1}{C_{n-2}R_{n-2}} & -\ddots & \ddots & 0 & 0 & 0 \\ \vdots & \vdots & \ddots & \ddots & \ddots & \vdots & \vdots \\ 0 & 0 & \cdots & \ddots & \ddots & \frac{1}{C_3R_2} & 0 \\ 0 & 0 & \cdots & \cdots & \frac{1}{C_2R_2} & -\frac{1}{C_2}\left(\frac{1}{R_2}+\frac{1}{R_1}\right) & \frac{1}{C_2R_1} \\ 0 & 0 & \cdots & \cdots & 0 & \frac{1}{(C_1+C_0)R_1} & -\frac{1}{C_1+C_0}\left(\frac{1}{R_1}+\frac{1}{R_0}\right) \end{bmatrix}$$ (26)

$$B = \begin{bmatrix} \frac{1}{(R_s+R_n)C_n} \\ 0 \\ \vdots \\ 0 \end{bmatrix}, C = [0 \ldots 0 \ 1] \text{ and } D = 0$$ (27)

Here the system matrix A has tri-diagonal elements: super-diagonal, diagonal, sub-diagonal. The i-th row has elements $C_{n-i+1}$, $R_{n-i+1}$ and $R_{n-i}$, and the row sum equals to 0 for $i=2, \ldots, n-1$. The $1^{st}$ row has elements $C_n$, $R_n$, $R_{n-1}$ and source resistor $R_s$, and its row sum equals to $$\frac{-1}{C_n(R_s+R_n)}.$$

The n-th row has elements $C_1$, $R_1$ and load resistor $R_0$ and capacitor $C_0$, and its row sum equals $$\text{to } -\frac{1}{(C_1+C_0)R_0}.$$

Its diagonal entries have negative sign as $$a_{ii} = -\frac{1}{C_{n-i+1}}\left(\frac{1}{R_{n-i+1}}+\frac{1}{R_{n-i}}\right), i = 2, \ldots, n-1,$$ (28)

$$a_{11} = -\frac{1}{C_n}\left(\frac{1}{R_s+R_n}+\frac{1}{R_{n-1}}\right) \text{ and}$$ (29)

$$a_{nn} = -\frac{1}{C_1+C_0}\left(\frac{1}{R_1}+\frac{1}{R_0}\right), n \geq 2.$$

Its super-diagonal entries have positive sign as $$a_{i,i+1} = \frac{1}{C_{n-i+1}R_{n-i}}, i = 1, \ldots, n-1, n \geq 2.$$ (30)

Its sub-diagonal entries have positive sign as $$a_{i,i-1} = \frac{1}{C_{n-i+1}R_{n-i+1}}, i = 2, \ldots, n-1, \text{ and}$$ (31)

$$a_{n,n-1} = \frac{1}{(C_1+C_0)R_1}, n \geq 2.$$

All other entries of matrix A are 0. The input matrix B has only one non-zero element in the first row $$b_1 = \frac{1}{(R_s+R_n)C_n}.$$ (32)

The output matrix C has only one nonzero element 1 in the n-th column $$c_n=1.$$ (33)

The direct output matrix D is 0. Therefore, it is clear that the computation complexity of this state space model is only O(n).

If the i-th node voltage is needed, the output matrix C can be set as C=[0 . . . 1 . . . 0] with its i-th entry as 1, i.e., $c_i=1$, and all others as 0, and the system matrix A, the input matrix B and the direct output matrix D are all the same as in (26–27) respectively. Thus, this state space model can check any node voltage by adjusting its corresponding output matrix C.

Equations (26–27) are a closed form of the exact space state model for the n-th order distributed interconnect and transmission line of Model 1 in FIG. 1, where n>>1 usual. However, it is also valid for any n>1. The corresponding method and algorithm are the above Method SS1 as shown in the above section.

For a special case n=1, the above model is reduced to the follows:

$$A = -\frac{1}{C_0+C_1}\left(\frac{1}{R_0}+\frac{1}{R_s+R_1}\right),$$ (34)

-continued $$B = \frac{1}{(C_0 + C_1)(R_s + R_1)}, C = 1 \text{ and } D = 0.$$

It usually relates to the model reduction with order one, while the distributed interconnect characters are captured by a very large order n.

A.2. Model 2—without Load and Source Parts:

FIG. 2 shows a preferred embodiment Model 2 that is the interconnect and transmission line itself, without any disturbance or distortion from various source and load parts. This case is particularly important since it describes the propagation delay characteristics of a distributed RC line without any distortion of the load gate impedances and source impedances. Its state space model in an exact closed form is as follows $$A = \begin{bmatrix} -\frac{1}{C_n}\left(\frac{1}{R_n} + \frac{1}{R_{n-1}}\right) & \frac{1}{C_n R_{n-1}} & 0 & \cdots & 0 & 0 \\ \frac{1}{C_{n-1}R_{n-1}} & -\frac{1}{C_{n-1}}\left(\frac{1}{R_{n-1}} + \frac{1}{R_{n-2}}\right) & \frac{1}{C_{n-1}R_{n-2}} & \cdots & 0 & 0 \\ 0 & \frac{1}{C_{n-2}C_{n-2}} & -\frac{1}{C_{n-2}}\left(\frac{1}{R_{n-2}} + \frac{1}{R_{n-3}}\right) & \cdots & 0 & 0 \\ \vdots & \vdots & \vdots & \ddots & \vdots & \vdots \\ 0 & 0 & 0 & \cdots & -\frac{1}{C_2}\left(\frac{1}{R_2} + \frac{1}{R_1}\right) & \frac{1}{C_2 R_1} \\ 0 & 0 & 0 & \cdots & \frac{1}{C_1 R_1} & -\frac{1}{C_1 R_1} \end{bmatrix}$$
(35)

$$B = \begin{bmatrix} \frac{1}{R_n C_n} \\ 0 \\ \vdots \\ 0 \end{bmatrix}, C = [0 \ 0 \ \cdots \ 1], \text{ and } D = 0, n \geq 1.$$
(36)

If n=1, then its state space model is as $$A = -\frac{1}{C_1 R_1}, B = \frac{1}{C_1 R_1}, C = 1 \text{ and } D = 0.$$
(37)

Therefore, it is observed that the closed formula in (35)–(36) is also valid for n=1, if the lower right corner entry of matrix A, the top entry of matrix B and the far right entry of matrix C are kept as the reduced form.

The method to get this model and calculation algorithm are similar to the one described above as follows.

Method SS2:

i) Set order n.

ii) Set the state matrix A as (35)

First let matrix A be an n×n matrix, then $$a_{nn} = -\frac{1}{C_1 R_1}.$$
(38)

If $n > 1$, then for $i = 1, \cdots, n-1$ $$a_{ii} = -\frac{1}{C_{n-i+1}}\left(\frac{1}{R_{n-i+1}} + \frac{1}{R_{n-i}}\right),$$
(39)

$$a_{i,i+1} = \frac{1}{C_{n-i+1} R_{n-i}}$$
(40)

end
(41)

if $n > 1$, then for $i = 2, \cdots, n$ $$a_{i,i-1} = \frac{1}{C_{n-i+1} R_{n-i+1}}$$
(42)

end iii) Set the input matrix B, an n×1 column vector as a zero vector first, i.e., B=0, $$b_i = 0, \ i = 1, \cdots, n, \text{ then } b_1 = \frac{1}{R_n C_n}.$$
(43)

iv) Set the output matrix C, an 1×n row vector as a zero vector first. Then in order to select node n−j+1 as an output node, let $c_j=1$, $j \in \{1, \ldots, n\}$ $(c_i=0, i=1, \ldots, n, i \neq j)$; usually $j=n$,
(44)

v) Set the direct output scalar D=0.

vi) Stop.

Thus, the state space model {A,B,C,D} is established by the said closed form (35–36) for Model 2.

A.3. Model 3—Even Distributed with Load and Source Parts:

FIG. 3 shows a preferred embodiment Model 3 that is the even distributed interconnect and transmission line with the source and load parts. Its state space model in an exact closed form is as follows:

$$A = \frac{1}{RC}\begin{bmatrix} -1-\frac{1}{1+R_s/R} & 1 & 0 & \cdots & 0 & 0 \\ 1 & -2 & 1 & \cdots & 0 & 0 \\ 0 & 1 & -2 & \cdots & 0 & 0 \\ \vdots & \vdots & \vdots & \ddots & \vdots & \vdots \\ 0 & 0 & 0 & \cdots & -2 & 1 \\ 0 & 0 & 0 & \cdots & \frac{1}{1+C_0/C} & -\frac{1}{1+C_0/C}\left(\frac{R}{R_0}+1\right) \end{bmatrix},$$

$$B = \frac{1}{RC}\begin{bmatrix} \frac{1}{1+R_s/R} \\ 0 \\ \vdots \\ 0 \end{bmatrix},$$

$C = [\,0 \;\; 0 \;\; \cdots \;\; 1\,]$ and $D = 0, n > 1$. (46)

It should be pointed out and emphasized that the above closed form involves only 15 times of multiplications and divisions for any large order n (n>>1). This means that its computation complexity is fixed and less than O(n), and that is O(1)!

For a special case n=1, the above model is reduced to the follows:

$$A = -\frac{1}{C_0+C}\left(\frac{1}{R_0} + \frac{1}{R_s+R}\right) \qquad (47)$$
$$= -\frac{1}{CR}\cdot\frac{1}{1+C_0/C}\left(\frac{R}{R_0} + \frac{1}{1+R_s/R}\right),$$

$$B = \frac{1}{(C_0+C)(R_s+R)} \qquad (48)$$
$$= \frac{1}{CR}\cdot\frac{1}{(1+C_0/C)(1+R_s/R)},$$

$C = 1$ and $D = 0$.

This closed form shows the affect of the source and load parts to Model 3 is by the ratios of $R_s/R$, $R/R_0$ and $C_0/C$. When they are small enough, then they can be dropped respectively. One extreme case is Model 4 without the source and load parts. Model 4 is a special case of Model 3 by dropping all these factors in the closed form formula.

The method to get this model and calculation algorithm is similar to the one described above as follows.

Method SS3:
i) Set order n.
ii) If n=1, then set $$A = -\frac{1}{C_0+C}\left(\frac{1}{R_0} + \frac{1}{R_s+R}\right), B = \frac{1}{(C_0+C)(R_s+R)}, \qquad (49)$$

$C = 1$ and $D = 0$.

Stop.
If n>1, then go next step
iii) Set the state matrix A as (45).
First let matrix A be an n×n zero matrix, then $$a_{nn} = -\frac{1}{RC(1+C_0/C)}\left(\frac{R}{R_0}+1\right), a_{11} = -\frac{1}{CR}\left(\frac{1}{1+R_s/R}+1\right), \qquad (50)$$

if $n > 2$, then for $i = 2, \cdots, n-1$

-continued $$a_{ii} = -\frac{2}{CR}, a_{i,i+1} = \frac{1}{CR}, a_{i,i-1} = \frac{1}{CR} \qquad (51)$$

end $$a_{12} = \frac{1}{CR}, a_{n,n-1} = \frac{1}{CR}\cdot\frac{1}{1+C_0/C}. \qquad (52)$$

iv) Set the input matrix B, an n×1 column vector as a zero vector first, then let $$b_1 = \frac{1}{RC}\cdot\frac{1}{1+R_s/R}. \qquad (53)$$

v) Set the output matrix C, an 1×n row vector as a zero vector first, then in order to select node n−j+1 as an output node, let $c_j=1, j\in\{1, \ldots, n\}$; usually j=n. (54)

vi) Set the direct output scalar D=0.
vii) Stop.

Thus, the state space model {A,B,C,D} is established by the said closed form (45–46) for Model 3.

A.4. Model 4—Even Distributed without Load and Source Parts:

FIG. 4 shows a preferred embodiment Model 4 that is the even distributed interconnect and transmission line itself, without the source and load parts. Thus it is without any disturbance or distortion from various source and load parts. Its state space model in an exact closed form is as follows $$A = \frac{1}{RC}\begin{bmatrix} -2 & 1 & 0 & \cdots & 0 & 0 \\ 1 & -2 & 1 & \cdots & 0 & 0 \\ 0 & 1 & -2 & \cdots & 0 & 0 \\ \vdots & \vdots & \vdots & \ddots & \vdots & \vdots \\ 0 & 0 & 0 & \cdots & -2 & 1 \\ 0 & 0 & 0 & \cdots & 1 & -1 \end{bmatrix}, B = \frac{1}{RC}\begin{bmatrix} 1 \\ 0 \\ \vdots \\ 0 \end{bmatrix}, \qquad (55)$$

$C = [\,0 \;\; 0 \;\; \cdots \;\; 1\,]$ and $D = 0, n > 1$.

For a special case n=1, the above model is reduced to the follows:

$$A = -\frac{1}{CR}, B = \frac{1}{CR}, C = 1 \text{ and } D = 0. \quad (56)$$

It should be pointed out and emphasized that the above closed form involves only 2 times of multiplications and 1 time of division for any large order n (n>>1). This means that its computation complexity is a constant 3, i.e., O(1)!

The method to get this model and calculation algorithm are similar to the one described above as follows.

Method SS4:
i) Set order n.
ii) If n=1, then set $$A = -\frac{1}{CR}, B = \frac{1}{CR}, C = 1 \text{ and } D = 0. \quad (57)$$

Stop.
If n>1, then go next step.
iii) Set the state matrix A as (55)
First let matrix A be an n×n zero matrix, then $$a_{nn} = -\frac{1}{CR}, a_{n,n-1} = \frac{1}{CR} \quad (58)$$

for $i = 1, \cdots, n-1$ $$a_{ii} = -\frac{2}{CR}, a_{i,i+1} = \frac{1}{CR}, a_{i+1,i} = \frac{1}{CR} \quad (59)$$

end iv) Set the input matrix B, an n×1 column vector as a zero vector first, then let $$b_1 = \frac{1}{RC}. \quad (60)$$

v) Set the output matrix C, an 1×n row vector as a zero vector first, then in order to select node n−j+1 as an output node, let $$c_j = 1, j\epsilon\{1, \ldots, n\}; \text{ usually } j=n, \quad (61)$$

vi) Set the direct output scalar D=0.
vii) Stop.

Thus, the state space model {A,B,C,D} is established by the said closed form (55) for Model 4.

B. Calculating the Transfer Functions Recursively

It is illustrated in this subsection how to recursively calculate the transfer function at the output node of an RC interconnect and transmission line using the concepts developed in the previous subsection. Consider the general RC distributed interconnect and transmission line in FIGS. 1–4.

B.1. Model 1—with its Source and Load Parts

FIG. 1 shows Model 1 of the distributed RC interconnect and transmission line. The transfer function is obtained by the above described recursive algorithm. Here a preferred embodiment is simplified from that. The method to obtain the transfer function model $T_n(s)$ in (14)–(18), where n is the order of the circuit system, from the input $v_{in}(t)$ to the output $v_0(t)$ is in the following recursive algorithm (a detail form).

Method TF1-1:

(i) Input all data: n; $R_i$, i=1, ... n; $R_s$; $1/R_0$; $C_0$; and $C_i$, i=1, ... n; \quad (62)

(ii) Set new $$R_n = R_n + R_s, C_1 = C_1 + C_0; \quad (63)$$

(iii) Set the numerator of the transfer function as $$N_n(s) = \prod_{i=1}^{n} \frac{1}{C_i R_i};$$

(i.e., as same as the original $$N_n(s) = \frac{1}{C_n(R_s + R_n)} \cdot \frac{1}{1 + C_0/C_1} \prod_{i=1}^{n-1} \frac{1}{C_i R_i}) \quad (64)$$

(iv) Set the recursive initiate values $$D_0(s) = 1 \text{ and } D_1(s) = s + \frac{1}{C_1}\left(\frac{1}{R_1} + \frac{1}{R_0}\right); \quad (65)$$

(v) If $n = 1$, then $$T_1(s) = \frac{N_1(s)}{D_1(s)} \quad (66)$$

Stop
If n>1, go to the next step.
(vi) If n>1, then for j=2, ..., n $$D_j(s) = \left[s + \frac{1}{C_j}\left(\frac{1}{R_j} + \frac{1}{R_{j-1}}\right)\right]D_{j-1}(s) - \frac{1}{C_j R_{j-1}^2 C_{j-1}}D_{j-2}(s) \quad (67)$$

end (vii) Thus, the transfer function model is $$T_n(s) = \frac{N_n(s)}{D_n(s)}. \quad (68)$$

B.2. Model 2—without Load and Source Parts:

FIG. 2 shows a preferred embodiment Model 2 that is the RC interconnect and transmission line itself, without any disturbance or distortion from various source and load parts. The method to get the transfer function is as follows via the previous recursive method TF1-1.

This case (Model 2) in FIG. 2 can be viewed as a special case of Model 1 in FIG. 1 by setting the source resistor and load capacitor to be zero and the load resistor to be infinite as $$R_s=0, \ C_0=0, \text{ and } 1/R_0=0 \text{ in step (i).} \quad (69)$$

Then apply the recursive algorithm TF1-1 in (62)–(68). This makes Method TF2-1.

Another way is to set a new simple Step (i) instead to Step (i) and (ii) in the above, making a new algorithm as follows.

Method TF2-2:

(i) Input all data: n; and $R_i$, i=1, . . . n; and $C_i$, i=1, . . . n; (70)

(ii) Set the numerator of the transfer function as $$N_n(s) = \prod_{i=1}^{n} \frac{1}{C_i R_i}; \quad (71)$$

(iii) Set the recursive initiate values $$D_0(s) = 1 \text{ and } D_1(s) = s + \frac{1}{C_1 R_1}; \quad (72)$$

(iv) If $n > 1$, for $j = 2, \cdots, n$ $$D_j(s) = \left[s + \frac{1}{C_j}\left(\frac{1}{R_j} + \frac{1}{R_{j-1}}\right)\right] D_{j-1}(s) - \quad (73)$$

$$\frac{1}{C_j R_{j-1}^2 C_{j-1}} D_{j-2}(s)$$

end (v) Thus, the transfer function model is $$T_n(s) = \frac{N_n(s)}{D_n(s)}. \quad (74)$$

B.3; Model 3—Even Distributed with Load and Source Parts:

FIG. 3 shows a preferred embodiment Model 3 that is the even distributed interconnect and transmission line with the source and load parts. The ways to get its transfer function model can be several following methods:

Method TF3-1 is exactly the same to Method TF1-1 just with $R_i=R$ and $C_i=C$, i=1 . . . , n.

Method TF3-2:

(i) Input all data: n, R, $R_s$, $1/R_0$, $C_0$, and C; (75)

(ii) Set the numerator of the transfer function as $$N_n(s) = \frac{1}{1 + R_s/R} \cdot \frac{1}{1 + C_0/C} \prod_{i=1}^{n} \frac{1}{CR}; \quad (76)$$

(iii) Set the recursive initiate values $$D_0(s) = 1 \text{ and } D_1(s) = s + \frac{1}{C + C_0}\left(\frac{1}{R} + \frac{1}{R_0}\right); \quad (77)$$

If $n = 2$, then $$D_2(s) = \left[s + \frac{1}{C}\left(\frac{1}{R_s + R} + \frac{1}{R}\right)\right] D_1(s) - \frac{1}{C^2 R^2(1 + C_0/C)} D_0(s) \quad (78)$$

go to the last step;

(v) If n>2, then $$D_2(s) = \left[s + \frac{2}{CR}\right] D_1(s) - \frac{1}{C^2 R^2(1 + C_0/C)} D_0(s); \quad (79)$$

If $n > 3$, for $j = 3, \ldots, n-1$ $$D_j(s) = \left[s + \frac{2}{CR}\right] D_{j-1}(s) - \frac{1}{C^2 R^2} D_{j-2}(s); \quad (80)$$

end (vi) Set (81)

$$D_n(s) = \left[s + \frac{1}{C}\left(\frac{1}{R_s + R} + \frac{1}{R}\right)\right] D_{n-1}(s) - \frac{1}{C^2 R^2} D_{n-2}(s);$$

(vii) Thus, the transfer function model is $$T_n(s) = \frac{N_n(s)}{D_n(s)}. \quad (82)$$

For n=1, it is discussed in the late section.

For a special case with $R_s=0$ and $C_0=0$, the algorithm for calculating $$T_n(s) = \frac{N_n(s)}{D_n(s)}$$

has $$N_n(s) = \frac{1}{C^n R^n}, \ D_j(s) = \left[s + \frac{2}{CR}\right] D_{j-1}(s) - \frac{1}{C^2 R^2} D_{j-2}(s), \quad (83)$$

for any $j \geq 2$.

with $$D_0(s) = 1, \ D_1(s) = s + \frac{1}{C}\left(\frac{1}{R} + \frac{1}{R_0}\right) \quad (84)$$

B.4. Model 4—Even Distributed without Load and Source Parts:

FIG. 4 shows a preferred embodiment Model 4 that is the even distributed interconnect and transmission line itself, without the source and load parts. Thus it is without any disturbance or distortion from various source and load parts. The recursive way to generate the transfer function of this model is $$T_n(s) = \frac{N_n(s)}{D_n(s)}, \ N_n(s) = \frac{1}{C^n R^n}, \quad (85)$$

$$D_j(s) = \left[s + \frac{2}{CR}\right] D_{j-1}(s) - \frac{1}{C^2 R^2} D_{j-2}(s), \ j = 2, \ldots, n,$$

with initial values $$D_0(s) = 1, D_1(s) = s + \frac{1}{CR}. \quad (86)$$

Its transfer function model can be obtained via the following recursive methods.

Method TF4-1: Using Method TF1-1 by setting $R_s=0$, $C_0=0$, $1/R_0=0$, $R_i=R$ and $C_i=C$, $i=1, \ldots, n$.

Method TF4-2: Using Method TF3-2 by setting $R_s=0$, $C_0=0$, and $1/R_0=0$.

Method TF4-3:

(i) Input all data: n, R, and C;

(ii) Set the numerator of the transfer function as $$N_n(s) = \prod_{i=1}^{n} \frac{1}{CR}; \quad (87)$$

(iii) Set initiate values $$D_0(s) = 1 \text{ and } D_1(s) = s + \frac{1}{CR}; \quad (88)$$

If $n > 1$, for $j = 2, \ldots, n$ $$D_j(s) = \left[s + \frac{2}{CR}\right] D_{j-1}(s) - \frac{1}{C^2 R^2} D_{j-2}(s) \quad (89)$$

end (v) Thus, the transfer function model is $$T_n(s) = \frac{N_n(s)}{D_n(s)}. \quad (90)$$

C. Model Reduction and Approximation Order

It has been shown how to calculate the exact state space model via the above accurate closed-forms and the exact transfer functions via the recursive methods and algorithms. However, calculating these exact model with the order of thousands for typical large distributed interconnect and transmission line. In practice, there is no need to calculate the high order model of RC interconnect and transmission line, since the transient behavior can be accurately characterized by low order model, e.g., by a small number of dominant poles (typically several tens of poles). Now the above state models and transfer function models provide a basis and a starting point for model reduction or model truncation and further comparison. For example, the Balanced Truncation Method (BTM) can be applied to the above state space models for model reduction. The obtained transfer function models can be used for model reduction methods via frequency domain such as AWE, Padé approximation and other related methods. By comparison to the original model, the approximation order of the reduced model can be determined by the approximation performance requirements, such as accuracy and frequency range.

It is very powerful to reveal the relationship among the ELO reduction models and its original high order model. The method and relationship is as follows.

Consider an $n^{th}$-order even distributed RC interconnect circuit shown in FIG. 4 with its total length resistor $R_t$ and total capacitor $C_t$ in (25). Thus, its original $n^{th}$-order even distributed model is in (55) and (85). Its m-th-order ELO model $\{A_{em}, B_{em}, C_{em}, D\}$ is $$A_{em} = \frac{1}{r^2 RC} \begin{bmatrix} -2 & 1 & 0 & \ldots & 0 & 0 \\ 1 & -2 & 1 & \ldots & 0 & 0 \\ 0 & 1 & -2 & \ldots & 0 & 0 \\ \vdots & \vdots & \vdots & \ddots & \vdots & \vdots \\ 0 & 0 & 0 & \ldots & -2 & 1 \\ 0 & 0 & 0 & \ldots & 1 & -1 \end{bmatrix}, \quad (91)$$

$$B_{em} = \frac{1}{r^2 RC} \begin{bmatrix} 1 \\ 0 \\ \vdots \\ 0 \end{bmatrix}, C_{em} = [0 \ 0 \ \ldots \ 1], D = 0,$$

where $A_{em} \in R^{m \times m}$, $B_{em} \in R^{m \times 1}$, $C_{em} \in R^{1 \times m}$, R and C are the parameters of the original n-th model, and the order reduction ratio is $$r = n/m. \quad (92)$$

Its transfer function is $$T_{em}(s) = \frac{N_{em}(s)}{D_{em}(s)}, N_{em}(s) = \frac{1}{r^{2m} C^m R^m}, \quad (93)$$

$$D_{e,j}(s) = \left[s + \frac{2}{r^2 CR}\right] D_{e,j-1}(s) - \frac{1}{r^4 C^2 R^2} D_{e,j-2}(s),$$

$$j = 2, \ldots, m,$$

with its initial values $$D_{e0}(s) = 1, D_{e1}(s) = s + \frac{1}{r^2 CR}. \quad (94)$$

When m=1, the algorithm goes with r=n to $$N_{e1}(s) = \frac{1}{n^2 CR}, \text{ and } D_{e1}(s) = s + \frac{1}{n^2 CR} \quad (95)$$

Consider the even-distributed RC interconnect circuit with the source and load parts as shown in FIG. 3. Thus, its original $n^{th}$-order even distributed model is in (45)–(48). Then, its m-th reduced order ELO state space model $\{A_{em}, B_{em}, C_{em}, D\}$ is:

$$A_{em} = \frac{1}{r^2 RC} \begin{bmatrix} -1 - \frac{1}{1+R_s/rR} & 1 & 0 & \cdots & 0 & 0 \\ 1 & -2 & 1 & \cdots & 0 & 0 \\ 0 & 1 & -2 & \cdots & 0 & 0 \\ \vdots & \vdots & \vdots & \ddots & \vdots & \vdots \\ 0 & 0 & 0 & \cdots & -2 & 1 \\ 0 & 0 & 0 & \cdots & \frac{1}{1+C_0/rC} & -\frac{1}{1+C_0/rC}\left(1+\frac{rR}{R_0}\right) \end{bmatrix}, B_{em} = \frac{1}{r^2 RC} \begin{bmatrix} \frac{1}{1+R_s/rR} \\ 0 \\ \vdots \\ 0 \end{bmatrix},$$ (96)

$$C_{em} = [0 \ 0 \ \ldots \ 1] \text{ and } D = 0,$$ (97)

where $A_{em} \epsilon R^{m \times m}$, $B_{em} \epsilon R^{m \times 1}$, $C_{em} \epsilon R^{1 \times m}$ and R and C are the parameters of the original n-th model, and the order reduction ratio is r=n/m.

Its transfer functions is $$T_{em}(s) = \frac{N_{em}(s)}{D_{em}(s)}$$

with the initial values $$D_{e,0}(s) = 1, \; D_{e,1}(s) = s + \frac{1}{r^2 RC} \cdot \frac{1}{1+C_0/rC}\left(1 + \frac{rR}{R_0}\right)$$ (98)

$$D_{e,j}(s) = \left[s + \frac{2}{r^2 RC}\right] D_{e,j-1}(s) - \frac{1}{r^4 C^2 R^2} D_{e,j-2}(s),$$
$$j = 2, \ldots, m-1, (m > 2)$$ (99)

$$D_{em}(s) = \left[s + \frac{1}{r^2 CR}\left(\frac{1}{1+R_s/rR} + 1\right)\right] D_{e,m-1}(s) -$$
$$\frac{1}{r^4 C^2 R^2} D_{e,m-2}(s), (m \geq 2)$$ (100)

$$N_{em}(s) = \frac{1}{r^{2m}(1+C_0/rC)(1+R_s/rR)C^m R^m}$$ (101)

When m=1, it leads to r=n, $$N_{e1} = \frac{1}{(C_1+C_0)(R_t+R_s)} = \frac{1}{n^2 CR(1+C_0/nC)(1+R_s/nR)} \text{ and}$$ (102)

$$D_{e1}(s) = s + \frac{1}{C_t+C_0}\left(\frac{1}{R_s+R_t} + \frac{1}{R_0}\right) =$$
$$s + \frac{1}{n^2 CR} \cdot \frac{1}{1+C_0/nC}\left(\frac{1}{1+R_s/nR} + \frac{1}{R_0/nR}\right)$$ (103)

The above method shows that the ELO model with the source and load parts depends on its parameter ratios $R/R_s$, $R/R_0$, $C/C_0$, ($R_t/R_s$, $R_t/R_0$, $C_t/C_0$) and order reduction ratio r between its distribution parameters and external parameters respectively. There are two extreme situations for external parameters: one is interconnect itself without any distortion, and another one is with large external parameters. A regular case will be between these extreme cases. However, the reduced model for the interconnect itself can connect to various external source and load data.

D. Determining the Transient Response and the Bode Plots

Further, the above original models and their reduced order models can be used to determine and investigate their transient responses and Bode plots, i.e., their time domain performance and frequency domain performance, respectively. For example, some simple MATLAB command step (A,B,C,D) or step(n,d) for the step response, and bode(n,d) or bode(A,B,C,D) for Bode plot in frequency domain. These performance graphs and data can facilitate comparison of the original model and its reduced order model.

E. Complexity and Stability Characteristics

The methods just disclosed have a computation complexity of O(n) for the state space models, i.e., linearly proportional to the order of the order n, which is the number of RC sections in the interconnect and transmission line, and a computation complexity of multiplication $O((n-1)^2) \approx O(n^2)$ for transfer function model, which is less than the traditional method complexity $O(n^k)$ with k>2 or k>3. This linear complexity of O(n) results because the state space model methods avoid matrix inverse and matrix multiplication operations. That complexity of multiplication $O((n-1)^2)$ results because the transfer function model methods apply recursive algorithms, which involve only simple multiplications.

However, for evenly distributed RC interconnect and transmission line, the said closed form of state space model has its computation complexity of only a fixed constant, i.e., O(1). It is usually true that interconnect and transmission line, tree and net consist of evenly distributed sub-interconnect and sub-transmission lines. Thus, the computation complexity of the new methods disclosed here for their state space models are the product of their tree or net sub-piece number times O(1), that is much less than O(n).

These methods result the exact accurate models for the n-th order distributed RC interconnect and transmission line system. Therefore, these methods guarantee the derived models stability and also numerically stable for any order of the model. The methods also can be combined with scaling and other techniques.

The present method is specifically efficient to model the distributed nature of the interconnect impedance because its so simple calculation in the state space models and so easy recursive algorithms in the transfer function models, in addition to its high accuracy.

F. Experimental Results

The said closed-form in the state space model is much useful for time domain simulation, especially the step response that is commonly used in test and evaluation. If a system is described in transfer function, it is first converted to state space in time-domain when a step response is required. However, the transfer function is much useful for the frequency domain simulation and evaluation, especially the Bode plot that is commonly used in evaluation and analysis in frequency domain. If a system is described in a state space model, it is first converted to transfer function in frequency domain when a Bode plot is required.

The presented said methods will now be applied to calculate the transient response of step response and the Bode plots of frequency response of two evenly distributed RC interconnect and transmission lines. Two cases are considered here as examples. Case 1 is an interconnect and transmission line itself without its source and load parts, while Case 2 is this interconnect and transmission line with its source and load parts. The resulting exact models are further used to derive the BTM reduced models and ELO reduced models. Then, the resulting step responses and Bode plots of the original models are compared to the corresponding step responses and Bode plots of their BTM and ELO reduced order models, respectively.

Case 1. Consider an even distributed RC interconnect Model 4 of 0.01 cm long with distribution characteristic data of resistor 5.5 k$\Omega$/m and capacitor 94.2 pF/m. An 100$^{th}$-order model is used as its original model with R=5.5·10$^{-3}$ $\Omega$ and C=9.42·10$^{-5}$ pF.

Case 2. Consider the same even distributed RC interconnect in Case 1, but with a source resistor $R_s$=500 $\Omega$, a load resistor $R_0$=1 M$\Omega$, and a load capacitor $C_0$=1 pF in Model 3. Here, these external parameters data are dominate, comparing with the distributed parameter data of R and C.

Case 1.A. By applying the Method SS4 for Model 4 to Case 1, the 100-th order original model S={A,B,C,D} is:

$$A = 1.9301 \cdot 10^{18} \begin{bmatrix} -2 & 1 & 0 & \cdots & 0 & 0 \\ 1 & -2 & 1 & \cdots & 0 & 0 \\ 0 & 1 & -2 & \cdots & 0 & 0 \\ \vdots & \vdots & \vdots & \ddots & \vdots & \vdots \\ 0 & 0 & 0 & \cdots & -2 & 1 \\ 0 & 0 & 0 & \cdots & 1 & -1 \end{bmatrix},$$

$$B = 1.9301 \cdot 10^{18} \begin{bmatrix} 1 \\ 0 \\ \vdots \\ 0 \end{bmatrix}, C = [0 \ 0 \ \cdots \ 1] \text{ and } D = 0;$$

Then, applying the BTM model reduction to the original model results the BTM models $S_m = \{A_m, B_m, C_m, D\}, m \ll n, \text{ e.g., } S_l \text{ is:}$ $A_1 = -2.4876 \cdot 10^{14}, B_1 = 1.7024 \cdot 10^7, C_1 = 1.7024 \cdot 10^7;$ $S_2$:

$$A_2 = 10^{14} \begin{bmatrix} -2.4876 & 7.0384 \\ -7.0384 & -21.789 \end{bmatrix}, B_2 = 10^7 \begin{bmatrix} 1.7024 \\ 2.0209 \end{bmatrix},$$

$C_2 = 10^7 [1.7024 \ -2.0209];$ and $S_3$:

$$A_3 = 10^{14} \begin{bmatrix} -2.4876 & 7.0384 & -3.5161 \\ -7.0384 & -21.789 & 30.672 \\ -3.5161 & -30.672 & -59.418 \end{bmatrix}, B_3 = 10^7 \begin{bmatrix} 1.7024 \\ 2.0209 \\ 1.2294 \end{bmatrix},$$

$C_3 = 10^7 [1.7024 \ -2.0209 \ 1.2294].$

FIG. 5 shows the step responses of the original 100th order model in approaching 1 and its balance reduction models of orders 1, 2, 3, 10 and 25, in the top, below, close to, and last two as same as original one, respectively.

FIGS. 6–7 show the Bode plots of the original system S and the BTM reduced models $S_1, S_2, S_3, S_5, S_{10}, S_{25}$ and $S_{50}$ in the frequency domain for different frequency ranges. The curves of models S, $S_1, S_2, S_3, S_5, S_{10}, S_{25}$ and $S_{50}$ show that the lower order model curve has the larger difference from the original model curve, respectively. The Bode plot can be executed from either the state space model or its transfer function model obtained by the recursive algorithm described above or the MATLAB command ss2tf. However, the results from the recursive algorithm are more accurate than those from the other methods. The original model show an increasing level suppression as the frequency increases in the very high frequency range greater than $10^{16}$ Hz. However, the reduced order models can not follow this property when the frequency above a certain frequency, that we call the discord (or separate) frequency $f_d$ of model approximation. The reduced model approximation error is defined as the $H_\infty$-norm of the transfer function difference between the original model and the reduced model. Table 1 summarizes the original model and the BTM reduced models performances, where the error upper bound is calculated by its well known truncated balanced grammian.

TABLE 1

The Performance Comparison of the Original Model and the BTM Models

| Performance | Original model | BTM order 1 | BTM order 2 | BTM order 3 | BTM order 10 | BTM order 25 |
| --- | --- | --- | --- | --- | --- | --- |
| Step Response DC value | 1.0 | 1.16 | 0.978 | 1.006 | 1.0 | 1.0 |
| Discord $f_d$ ×10$^{15}$ Hz | | 0.611 | 1.08 | 2.35 | 23.8 | 48.9 |
| Error Upper Bound $\bar{E}_m$ | | $2.1684 \cdot 10^{-1}$ | $2.9404 \cdot 10^{-2}$ | $3.9684 \cdot 10^{-3}$ | $1.9479 \cdot 10^{-8}$ | $2.3853 \cdot 10^{-12}$ |
| Error $E_m$ | | $1.6568 \cdot 10^{-1}$ | $2.2649 \cdot 10^{-2}$ | $3.0791 \cdot 10^{-3}$ | $4.1245 \cdot 10^{-9}$ | $8.7070 \cdot 10^{-13}$ |

Case 1.B. Experiment data include an $100^{th}$ original model in Case 1 and the ELO reduced models with orders of 1, 2, 3, 10 and 25 as follows. The ELO reduced model is just an m-th order model in Model 4 with R and C proportional to its piece length. The ELO models are obtained by using the said methods disclosed above.

The original $100^{th}$-order model $\{A,B,C,D\}$ is as in Case 1.A. Its $m^{th}$-order ELO models $\{A_{em}, B_{em}, C_{em}, D\}$, m=1, 2, 3, are as follows:

$$A_{e1} = -1.9301 \cdot 10^{14}, B_{e1} = 1.9301 \cdot 10^{14}, C_{e1} = 1;$$

$$A_{e2} = 10^{14} \begin{bmatrix} -15.441 & 7.7205 \\ 7.7205 & -7.7205 \end{bmatrix}, B_{e2} = 10^{14} \begin{bmatrix} 7.72057 \\ 0 \end{bmatrix},$$

$$C_{e2} = [\, 0 \quad 1 \,];$$

$$A_{e3} = 10^{15} \begin{bmatrix} -3.4742 & 1.7371 & 0 \\ 1.7371 & -3.4742 & 1.7371 \\ 0 & 1.7371 & -1.7371 \end{bmatrix},$$

$$B_{e3} = 10^{15} \begin{bmatrix} 1.7371 \\ 0 \\ 0 \end{bmatrix}, C_{e3} = [\, 0 \quad 0 \quad 1 \,].$$

Their respective transfer functions $$T_{em}(s) = \frac{N_{em}}{D_{em}(s)}, m = 1, 2, 3,$$

are as follows, $N_{e1} = 1.9301 \cdot 10^{14}$, $D_{e1}(s) = s + 1.9301 \cdot 10^{14}$;

$N_{e2} = 5.9606 \cdot 10^{29}$, $D_{e2}(s) = s^2 + 2.3162 \cdot 10^{14} s + 5.9606 \cdot 10^{29}$;

$N_{e3} = 5.2419 \cdot 10^{45}$, $D_{e3}(s) = s^3 + 8.6856 \cdot 10^{15} \cdot s^2 + 1.8105 \cdot 10^{31} \cdot s + 5.2419 \cdot 10^{45}$.

Their respective approximation errors are as follows:

$E_{e1} = 0.35435 = -9.0114$ db, $E_{e2} = 0.23310 = -12.6492$ db, $E_{e3} = 0.16733 = -15.5285$ db.

FIG. 8 shows the step responses of the original model and ELO reduction models with orders 1, 2, 3, 5 10, 25 and 50. The steepest curve is of the original model with the fastest rising time. The ELO reduced models have slow/large rising time. The lower the order of the ELO model is, the larger the rising time is. It is observed that all ELO reduced models have the same final value as the original model has, i.e., their DC values are the same. However, in BTM the DC matching is a problem for $1^{st}$, $2^{nd}$ and $3^{rd}$ order reduction models.

FIGS. 9–10 show their Bode plots in different frequency ranges. The ELO reduction models coincide well with the original one in a very large range of frequencies, especially in low frequencies, as shown in time domain they have the same DC value, i.e., the final value in step responses. However, their Bode plots are different in a sufficient high frequency range, as shown in time domain they have different rising time, i.e., their transient responses are different.

Table 2 summarizes their performances. The rising time in the table is defined as the time at which the step response reaches 0.9.

Therefore, it is observed that at least the 5th order or a higher $10^{th}$ order ELO model is required for a sufficiently good approximation to the original $100^{th}$-order model from the time domain responses. It is obvious and natural that the higher the ELO model order is, the better its approximation is.

TABLE 2

Performance Comparison of the Original Model and ELO Model Reduction

| Performance | Original model | ELO order 1 | ELO order 2 | ELO order 3 | ELO order 5 | ELO order 10 | ELO order 25 | ELO order 50 |
|---|---|---|---|---|---|---|---|---|
| Rising Time $\times 10^{-15}$ sec | 5.40 | 11.9 | 8.36 | 7.29 | 6.51 | 5.90 | 5.56 | 5.45 |
| Discord $f_d$ $\times 10^{15}$ Hz | | 1.20 | 3.12 | 6.36 | 15.1 | 46.0 | 274 | 732 |
| Bandwidth $\times 10^{13}$ Hz | 7.39 | 3.06 | 4.59 | 5.36 | 6.11 | 6.74 | 7.16 | 7.30 |
| H-inf Norm Error $E_{em}$ | | 0.35435 | 0.23310 | 0.16733 | 0.10626 | 8.8609e−15 | 8.5840e−15 | |

Case 1.C. Applying optimal searching based on the above said models and methods, FIGS. 11–12 shows comparison of the regular ELO model and optimized ELO model of the first order to the original model of order 100 for step response and Bode plot respectively. In FIG. 11, the original model curve is in the middle, the regular ELO model curve is in the right, and the optimized ELO curve is in the left. In FIG. 12, the original model curve and the optimal ELO model curve coincide in the top, while the regular ELO model curve is below them. It is observed that the optimization greatly improves the first order ELO model to approach the original model in both step response and Bode plot. Its Bode plot is almost as same as the original model in the displayed frequency window up to $10^{16}$ Hz. It further demonstrates that the said new models and methods are so effective and powerful in far-reaching areas.

Case 2.A. By applying the methods for Model 3 to Case 2, its original $100^{th}$ order model S is:

$$A = 1.9301 \cdot 10^{18} \begin{bmatrix} -1 & 1 & 0 & \cdots & 0 & 0 \\ 1 & -2 & 1 & \cdots & 0 & 0 \\ 0 & 1 & -2 & \cdots & 0 & 0 \\ \vdots & \vdots & \vdots & \ddots & \vdots & \vdots \\ 0 & 0 & 0 & \cdots & -2 & 1 \\ 0 & 0 & 0 & \cdots & 9.4191 \cdot 10^{-5} & -9.4191 \cdot 10^{-5} \end{bmatrix},$$

-continued $$B = 1.9301 \cdot 10^{13} \begin{bmatrix} 1.1 \\ 0 \\ \vdots \\ 0 \end{bmatrix}, C = [\,0 \ \cdots \ 0 \ 1\,], D = 0.$$

Its corresponding BTM reduced order models of $S_1$ is:

$$A_1 = -1.9801 \cdot 10^9, \ B_1 = 4.4488 \cdot 10^4, \ C_1 = 4.4488 \cdot 10^4.$$

FIG. 13 shows their step responses. FIGS. 14–15 show their Bode plots in different frequency ranges. The former is specific for their discord frequencies, and the latter is specific for frequency range up to $10^9$ Hz, in which they are all the same due to the dominate external data.

Case 2.B. Consider the same even distributed RC interconnect as in Case 2.A, its same original $100^{th}$ order model, but its ELO reduction models obtained by using the methods in Sections A.3 and B.3. The ELO state space and transfer function models of orders 1, 2 and 3 are the followings:

$$A_{e1} = -1.9801 \cdot 10^9, \ B_{e1} = 1.9792 \cdot 10^9, \ C_{e1} = 1;$$

$$N_{e1} = 1.9792 \cdot 10^9, \ D_{e1}(s) = s + 1.9801 \cdot 10^9;$$

$$A_{e2} = 10^{12} \begin{bmatrix} -772.48 & 772.05 \\ 3.6193 & -3.6193 \end{bmatrix}, \ B_{e2} = 10^{11} \begin{bmatrix} 4.2440 \\ 0 \end{bmatrix},$$

$$C_{e2} = [\,0 \ 1\,];$$

$$N_{e2} = 1.5360 \cdot 10^{24}, \ D_{e2}(s) = s^2 + 7.7610 \cdot 10^{14} + 1.5368 \cdot 10^{24};$$

$$A_{e3} = 10^{12} \begin{bmatrix} -1737.8 & 1737.1 & 0 \\ 1737.1 & -3474.2 & 1737.1 \\ 0 & 5.4375 & -5.4375 \end{bmatrix},$$

$$B_{e3} = 10^{11} \begin{bmatrix} 6.3671 \\ 0 \\ 0 \end{bmatrix}, C_{e3} = [\,0 \ 0 \ 1\,];$$

$$N_{e3} = 6.0141 \cdot 10^{39},$$

$$D_{e3}(s) = s^3 + 5.2174 \cdot 10^{15} \cdot s^2 + 3.0387 \cdot 10^{30} \cdot s + 6.0171 \cdot 10^{39}.$$

FIG. 16 shows the step responses of the original model and the ELO models of orders 1, 2, 3, 5, 10, 25 and 50. All step responses are almost the same.

FIGS. 17–18 show their Bode plots in different frequency ranges.

From the step responses and Bode plots, especially the errors, it is observed that the $1^{st}$-order BTM model and ELO model already provide very good approximation to an $100^{th}$-order even distributed RC interconnect because their above source and load data are dominate.

However, it is noticed and concerned that the required ELO model order for a very accurate model approximation to an even distributed interconnect depends on various detail source and load data. When the source resistance and load capacitance reduce and the load resistance increases, the ELO reduction model order should be larger than one in order to reach a good approximation. It is noticed that Case 1 is really an extreme case of a distributed interconnect without the source and load parts, but reflects the characteristics of the interconnect itself.

It is found that the methods disclosed here are useful, stable and accuracy; on the other hand they are also easy, simply and effective for use with low computation complexity and less time-cost.

What I claim as my invention is:

1. A method for establishing an m-th order even-length-order (ELO) reduction circuit model and its time-domain state space model of an even RC interconnect or transmission line for simulation, performance analysis or circuit design including the steps of
   (a) assigning an original order n to the even RC interconnect or transmission line with its even distributed resistance R and even distributed capacitance C for its n resistors and n capacitors respectively;
   (b) setting a reduced order m where m<n and a factor r with r=n/m;
   (c) forming the even RC interconnect or transmission line as an m-th reduced order circuit model having m sections in series from a source input terminal down to a final sink terminal with a source input terminal and m nodes, where m−1 nodes are conjunction nodes between the neighbor sections, and one end node is the final sink terminal, each section (say i, i=1, . . . , m) has an even distributed resistor with a resistance rR between two neighbor nodes and an even distributed capacitor with a capacitance rC between its downward node (say i) and ground;
   (d) building an m×m system matrix A, where its m−1 super-diagonal line entries and m−1 sub-diagonal line entries are the same as $$\frac{1}{r^2RC},$$

its diagonal line has m−1 entries as $$\frac{-2}{r^2RC}$$

and one corner entry as $$\frac{-1}{r^2RC},$$

and all other entries are zero;
   (e) building an m×1 input matrix B with only one non-zero entry as $$\frac{1}{r^2RC};$$

(f) building an 1×m output matrix C with only one non-zero value 1;
   (g) building a zero direct output matrix (scalar) D;
   (h) forming the m-th order time-domain state space model {A,B,C,D} by said four matrices A, B, C and D;
whereby a system equation $\dot{x}(t)=Ax(t)+Bu(t)$ and an output equation $y(t)=Cx(t)+Du(t)$ determine the reduction model behavior, where x(t) denotes a state variable vector consisting of m node voltage variables, u(t) denotes the source voltage, and y(t) denotes the final sink terminal node voltage, thus the even interconnect or transmission line has its m-th ELO reduction circuit model and its time-domain state space model with a closed form, the method has a minimal computation complexity O(1), making a basis for simulation, performance analysis, model reduction, optimization or circuit design.

2. The method of claim 1, further including the following steps of
(a) establishing an n-th order state space model by executing a group of the steps in claim 1 where m is replaced by n, and the factor r=1;
(b) setting a model reduction performance error criterion of the m-th order state space model from the n-th state space model;
(c) searching an optimal value of the factor r for the m-th ELO state space model by minimizing the performance criterion;
(d) building a new m-th ELO circuit model with new distributed resistance rR and distributed capacitance rC where the factor r is the searched optimal value r, and its new m-th ELO state space model by utilizing the searched optimal value r for the evenly distributed interconnect or transmission line;

whereby this method provides an optimized m-th order reduced state space model for the even RC interconnect or transmission line, that is a guaranteed stable and physical synthesizable reduced order RC model through this stable numerical method.

3. The method of claim 1, further including the following steps of
(a) inserting a source resistor $R_s$ at the input terminal, a load capacitor $C_0$ and a load resistor $R_0$ in parallel between the final sink terminal and the ground;
(b) assigning a source resistance to the $R_s$, a load capacitance to the $C_0$ and a load resistance to the $R_0$;
(c) modifying the system matrix A by changing one end entry $$\frac{-2}{r^2 RC}$$

in the diagonal line to be $\frac{-1}{r^2 RC}\left(1 + \frac{1}{1 + R_s/rR}\right)$, said corner entry $$\frac{-1}{r^2 RC}$$

in the diagonal line to be $$\frac{-1}{r^2 RC} \cdot \frac{1}{1 + C_0/rC}\left(1 + \frac{rR}{R_0}\right),$$

and the entry $$\frac{1}{r^2 RC}$$

next to said corner entry in the same row to be $$\frac{-1}{r^2 RC} \cdot \frac{1}{1 + C_0/rC};$$

(d) modifying the non-zero entry of the input matrix B from $$\frac{1}{r^2 RC}$$

to $$\frac{1}{r^2 RC} \cdot \frac{1}{1 + R_s/rR};$$

whereby the method still has the lowest computation complexity only O(1) for the even interconnect or transmission line with the source resistor, load resistor and capacitor.

4. The method of claim 3, further including the following steps of
(a) establishing an n-th order state space model by executing a group of the steps in claim 3 where m is replaced by n, and the factor r=1;
(b) setting a model reduction performance error criterion of the m-th order state space model from the n-th state space model;
(c) searching an optimal value of the factor r for the m-th ELO state space model by minimizing the performance criterion;
(d) building a new m-th ELO circuit model with new distributed resistance rR and distributed capacitance rC where the factor r is the searched optimal value r, and its new m-th ELO state space model by utilizing the searched optimal value r;

whereby this method provides an optimized m-th order reduced state space model for the even RC interconnect or transmission line with the source resistance, load resistance and capacitance, that is a guaranteed stable and physical synthesizable reduced order RC model through this stable numerical method.

5. The method of claim 1, wherein said capacitance value C is scaled to facilitate the simulation, performance analysis, or circuit design.

6. A software product utilizing said method in claim 1.

7. A hardware product utilizing said method in claim 1.

8. A method for establishing time-domain state space model of an RC interconnect or transmission line for simulation, performance analysis or circuit design including the steps of
(a) setting a model order n (n>1);
(b) forming the RC interconnect or transmission line as n sections in series from a source input terminal down to a final sink terminal with said source input terminal and n nodes, where n−1 nodes are conjunction nodes between the neighbor sections, and one end node is the final sink terminal, each section, say i, (in a sequence i=1, . . . , n) has a resistor with a distributed resistance $R_i$ connecting two neighbor nodes of section i and a capacitor with a distributed capacitance $C_i$ connecting its downward node i of section i and a ground;

(c) forming a source resistor with a resistance $R_s$ connected to a source signal and said source input terminal, and a load capacitor with a capacitance $C_0$ and a load resistor with a resistance $R_0$ in parallel connected to said final sink terminal and the ground based on the connection data;

(d) having an output port at one of said nodes with a voltage driven by the voltage of the source signal;

(e) taking voltages of said n nodes as a state variable vector, the source signal voltage as an input variable, and the output port voltage as an output variable for said time-domain state space model;

(f) building an n×n system matrix A with non-zeros entries only at its diagonal line, supper-diagonal line and sub-diagonal line (which are two off-diagonal lines), where two end entries of the diagonal line are $$-\frac{1}{C_n}\left(\frac{1}{R_s+R_n}+\frac{1}{R_{n-1}}\right) \text{ and } -\frac{1}{C_1+C_0}\left(\frac{1}{R_1}+\frac{1}{R_0}\right)$$

respectively, its n−2 middle entries of the diagonal line are in the form of $$-\frac{1}{C_i}\left(\frac{1}{R_i}+\frac{1}{R_{i-1}}\right),$$

i=2, . . . , n−1 respectively, n−1 entries of one said off-diagonal line are in the form of $$\frac{1}{C_i R_{i-1}},$$

i=2, . . . , n, n−2 entries of another said off-diagonal line are in the form of $$\frac{1}{C_i R_i},$$

i=2, . . . , n−1, one end entry of this another off-diagonal line is $$\frac{1}{(C_1+C_0)R_1}$$

next to the one diagonal entry with the load data;

(g) building an n×1 input matrix B with only one non-zero entry as $$\frac{1}{(R_s+R_n)C_n};$$

(h) building an output matrix C with an 1×n row having only one non-zero entry 1 for selecting said output port node voltage;

(i) building a zero direct output matrix D;

(j) forming the time-domain state space model {A,B,C,D} by said four matrices A, B, C and D;

whereby the state variable vector follows a differential equation called a system equation $\dot{x}(t)=Ax(t)+Bu(t)$, the output variable follows an algebraic equation called an output equation $y(t)=Cx(t)+Du(t)$ where $x(t)$ denotes the state variable vector, $u(t)$ denotes the source voltage, and $y(t)$ denotes an output vector for the output port voltage, the method establishes the time-domain state space model via said steps in a closed form, which largely reduces its computation complexity not only for establishing the model but also for simulation, performance analysis, model reduction, verification, or circuit design.

9. The method of claim 8, further including the step of executing a model reduction method, such as Balanced Truncation Method (BTM), Asymptotic Waveform Evaluation (AWE), Padé approximation via Lanczos approach (PVL), or Klyrov-Arnoldi-based reduced-order modeling.

10. The method of claim 8, further including the following steps of
(a) establishing a small m-th order (1<m<n) state space model by executing a group of the steps of claim 8 where n is replaced by m;
(b) setting a model reduction performance error criterion of the m-th order state space model from the original n-th state space model;
(c) searching a set of 2m optimal distributed parameters for the resistors and capacitors in the m-th order state space model by minimizing the performance criterion;
(d) building a new m-th order state space model by utilizing the searched optimal distributed parameters;
whereby this method provides an optimized m-th order reduced state space model for the interconnect or transmission line, that is a guaranteed stable and physical synthesizable reduced order RC model through this stable numerical method.

11. The method of claim 8, further including the following steps of
(a) building a 1st order reduced model having a resistor $R_r$ and a capacitor $C_r$, and establishing its 1st order state space model with a system matrix $$A_r = -\frac{1}{C_0+C_r}\left(\frac{1}{R_0}+\frac{1}{R_s+R_r}\right),$$

an input matrix $$B_r = \frac{1}{(C_0+C_r)(R_s+R_r)},$$

an output matrix $C_r=1$, and a direct output scalar D=0;
(b) setting a model reduction performance error criterion of the 1st order state space model from the original n-th state space model;
(c) searching a set of 2 optimal parameters of the resistor $R_r$ and the capacitor $C_r$ by minimizing the performance criterion;
(d) building a new 1st order state space model by utilizing the searched optimal parameters;
whereby this new state space model is an optimized 1st order state space model for the interconnect or transmission line, that is a stable and physical synthesizable 1st order RC model.

12. The method of claim 8, wherein
(a) said distributed resistances $R_i$, i=1, ..., n, are the same as an even resistance R, said distributed capacitances $C_i$, i 1, ..., n, are the same as an even capacitance C;
(b) the two end entries of the diagonal line reduce to $$-\frac{1}{C}\left(\frac{1}{R_s+R}+\frac{1}{R}\right) \text{ and } -\frac{1}{C+C_0}\left(\frac{1}{R}+\frac{1}{R_0}\right)$$

respectively, the n−2 middle entries of the diagonal line reduce to $$\frac{-2}{CR},$$

the n−1 entries of one said off-diagonal line reduce to $$\frac{1}{CR},$$

the n−2 entries of another said off-diagonal line also reduce to $$\frac{1}{CR},$$

and the end entry of this another off-diagonal line reduces to $$\frac{1}{(C+C_0)R};$$

(c) the non-zero entry of the input matrix B reduces to $$\frac{1}{(R_s+R)C};$$

whereby this closed form method establishes this state space model for an even distributed interconnect or transmission line with the source resistor, the load resistor and capacitor, by only O(1) computation complexity.

13. The method of claim 12, further including the following steps of
(a) establishing a small m-th order (m<n) state space model with an even resistance $R_r$ and an even capacitance $C_r$, where if m>1, by executing a group of the steps of claim 12 wherein n is replaced by m, or if m=1, by setting a system matrix $$A_r = -\frac{1}{C_0+C_r}\left(\frac{1}{R_0}+\frac{1}{R_s+R_r}\right),$$

an input matrix $$B_r = \frac{1}{(C_0+C_r)(R_s+R_r)},$$

an output matrix $C_r$=1, and a direct output scalar D=0;

(b) setting a model reduction performance error criterion of the m-th order state space model from the original n-th state space model;
(c) searching a set of 2 optimal distributed parameters for the even resistance $R_r$ and an even capacitance $C_r$ in the m-th order state space model by minimizing the performance criterion;
(d) building a new m-th order state space model by utilizing the searched optimal distributed parameters;
whereby this method provides an optimized even m-th order reduced state space model for the interconnect or transmission line, that is a guaranteed stable and physical synthesizable reduced order RC model through this stable numerical method.

14. A software product utilizing said method in claim 8.

15. A hardware product utilizing said method in claim 8.

16. A recursive method for establishing a frequency-domain transfer function model T(s) of an RC interconnect or transmission line for simulation, performance analysis or circuit design, including the steps of
(a) setting a model order n (n>1);
(b) forming the RC interconnect or transmission line as n sections in series from a source input terminal down to a final sink terminal with said source input terminal and n nodes, where n−1 nodes are conjunction nodes between the neighbor sections, and one end node is the final sink terminal, each section, say i, in a sequence i=1, ..., n, from the sink upward to the source, has a resistor with a distributed resistance $R_i$ connecting two neighbor nodes of section i and a capacitor with a distributed capacitance $C_i$ connecting its downward node i of section i and a ground;
(c) forming a source resistor with a resistance $R_s$ connected to a source signal and said source input terminal, and a load capacitor with a capacitance $C_0$ and a load resistor with a resistance $R_0$ in parallel connected to said final sink terminal and the ground;
(d) taking the source voltage signal as an input variable of the transfer function model, and the voltage at the final sink terminal as an output variable of the transfer function model;
(e) generating the numerator of said transfer function as a constant;
(f) generating the denominator polynomial, say $D_n$, (s), of said transfer function by a recursive process of executing n−1 recursive cycles, say cycle j, j=2, ..., n, wherein
  1. said each cycle j generates a new j-th order polynomial, say $D_j(s)$ (coefficients), based on its (j−1)-th order polynomial $D_{j-1}(s)$ (coefficients) and (j−2)-th order polynomial $D_{j-2}(s)$ (coefficients), which are generated respectively in its previous two cycles (j−1)-th and (j−2)-th, by utilizing the resistance $R_j$ and capacitance $C_j$ of the section j, the last cycle n also utilizes the source resistance $R_s$;
  2. said process has two initial polynomials (coefficients) $D_1(s)$ and $D_0(s)$, where $D_1(s)$ utilizes the resistance $R_1$ and capacitance $C_1$ of the section 1 and the load resistance $R_0$ and capacitance $C_0$, $D_0(s)$ is a constant;
whereby the frequency domain transfer function model of the RC interconnect or transmission line is established by said recursive method based on its two previous steps results, which is efficient and makes a basis for further simulation, model reduction, performance analysis, optimization or circuit design.

17. The method of claim 16, wherein
(a) said numerator is in a form of $$N_n(s) = \frac{1}{C_n(R_s + R_n)} \cdot \frac{1}{1 + C_0/C_1} \prod_{i=1}^{n-1} \frac{1}{C_i R_i};$$

(b) said two initial polynomials are respectively as $$D_1(s) = s + \frac{1}{C_1 + C_0}\left(\frac{1}{R_1} + \frac{1}{R_0}\right) \text{ and }$$

$D_0(s)=1$;

(c) said recursive cycle j (j<n) in said recursive process executes recursive formulation as follows:

for $j = 2$,
$$D_2(s) = \left[s + \frac{1}{C_2}\left(\frac{1}{R_2} + \frac{1}{R_1}\right)\right]D_1(s) - \frac{1}{C_2 R_1^2 (C_1 + C_0)}D_0(s),$$

for $j > 2$,
$$D_j(s) = \left[s + \frac{1}{C_j}\left(\frac{1}{R_j} + \frac{1}{R_{j-1}}\right)\right]D_{j-1}(s) - \frac{1}{C_j R_{j-1}^2 C_{j-1}}D_{j-2}(s);$$

(d) said last cycle n executes a formulation as for $n = 2$, then
$$D_2(s) = \left[s + \frac{1}{C_2}\left(\frac{1}{R_s + R_2} + \frac{1}{R_1}\right)\right]D_1(s) - \frac{1}{C_2 R_1^2 (C_1 + C_0)}D_0(s),$$

for $n > 2$, then
$$D_n(s) = \left[s + \frac{1}{C_n}\left(\frac{1}{R_s + R_n} + \frac{1}{R_{n-1}}\right)\right]D_{n-1}(s) - \frac{1}{C_n R_{n-1}^2 C_{n-1}}D_{n-2}(s).$$

18. The method of claim 17, further including the following steps of
(a) establishing a small m-th order (m<n) transfer function model, where if m>1, by executing a group of the steps of claim 17 wherein n is replaced by m, otherwise if m=1, by setting a 1 st order RC model;
(b) setting an optimal model reduction performance error criterion of the m-th order transfer function model from the n-th transfer function model;
(c) searching a set of optimal distributed parameters for the distributed resistors and capacitors in the m-th order transfer function model by minimizing the performance criterion;
(d) building a new m-th order transfer function model by utilizing the searched optimal distributed parameters as an m-th order reduced transfer function model for the interconnect or transmission line;
whereby the reduced transfer function model is an optimized m-th order RC transfer function model under the performance criterion, the reduced model is guaranteed stable and physical synthesizable via said method which is numerical stable, and it can be used for further simulation, performance analysis or circuit design.

19. The method of claim 18, wherein said source resistance $R_s$=0, said load capacitance $C_0$=0 and said load resistor is open, that is $1/R_0$=0, whereby the said recursive method generates an m-th order reduced transfer function model for the interconnect or transmission line itself without any load and source distortion.

20. The method of claim 17, wherein
(a) said distributed resistances are the same as an even resistance R, said distributed capacitances are the same as an even capacitance C;
(b) said numerator reduces to $$N_n(s) = \frac{1}{1 + R_s/R} \cdot \frac{1}{1 + C_0/C}\left(\frac{1}{CR}\right)^n;$$

(c) said initial value $D_1(s)$ reduces to $$D_1(s) = s + \frac{1}{C + C_0}\left(\frac{1}{R} + \frac{1}{R_0}\right);$$

(d) said recursive formulation in cycle j (j<n) reduces to $$\text{for } j = 2, D_2(s) = \left[s + \frac{2}{CR}\right]D_1(s) - \frac{1}{C^2 R^2 (1 + C_0/C)}D_0(s),$$

$$\text{for } j > 2, D_j(s) = \left[s + \frac{2}{CR}\right]D_{j-1}(s) - \frac{1}{C^2 R^2}D_{j-2}(s);$$

(e) said formulation in said last cycle n is as if $n = 2$, then $D_2(s)$
$$\left[s + \frac{1}{C}\left(\frac{1}{R_s + R} + \frac{1}{R}\right)\right]D_1(s) - \frac{1}{C^2 R^2 (1 + C_0/C)}D_0(s),$$
if $n > 2$, then $D_n(s)$
$$= \left[s + \frac{1}{C}\left(\frac{1}{R_s + R} + \frac{1}{R}\right)\right]D_{n-1}(s) - \frac{1}{C^2 R^2}D_{n-2}(s);$$

whereby said recursive method efficiently gets the transfer function model for an evenly distributed interconnect or transmission line with the source and load, making a basis for simulation, model reduction, performance analysis, or circuit design.

21. The method of claim 20, further including the following steps of
(a) establishing a small m-th order (m<n) transfer function model, where if m>1, by executing a group of the steps of claim 20 wherein n is replaced by m, otherwise if m=1, by setting a 1st order RC model;
(b) setting an optimal model reduction performance error criterion of the m-th order transfer function model from the n-th transfer function model;
(c) searching 2 optimal distributed parameters for the even distributed resistance and capacitance respectively in the m-th order transfer function model by minimizing the performance criterion;
(d) building a new m-th order transfer function model by utilizing the searched optimal distributed parameters as an m-th order reduced transfer function model for the interconnect or transmission line;

whereby the reduced transfer function model is an optimized m-th order RC transfer function model under the performance criterion, the reduced model is guaranteed stable and physical synthesizable via said method which is numerical stable, and it can be used for further simulation, performance analysis or circuit design.

22. The method of claim 21, wherein said source resistance $R_s=0$, said load capacitance $C_O=0$ and said load resistor is open, that is $1/R_O=0$, whereby the aid recursive method generates an m-th order reduced transfer function model for the interconnect or transmission line itself without any load and source distortion.

23. The method of claim 16, wherein said distributed capacitances values are scaled to facilitate simulations, model reduction, performance analysis, or circuit design.

24. A software product utilizing said method in claim 16.

25. A hardware product utilizing said method in claim 16.

* * * * *

UNITED STATES PATENT AND TRADEMARK OFFICE
CERTIFICATE OF CORRECTION

PATENT NO. : 7,124,388 B2  
APPLICATION NO. : 11/037701  
DATED : October 17, 2006  
INVENTOR(S) : Sheng-Guo Wang It is certified that error appears in the above-identified patent and that said Letters Patent is hereby corrected as shown below:

1. Column 3, line 54, " $10^{6 \times 106}$ " should read -- $10^6 \times 10^6$ --.
2. Column 6, line 7, " $u, (t)$ " in (5) should read -- $u(t)$ --.
3. Column 6, lines 20-27, all " $\cdot \cdot$ " in matrix A should read -- $\ddots$ --.
4. Column 6, line 60, " $a_{li} =$ " in (8) should read -- $a_{ii} =$ --.
5. Column 6, line 63, " $a_{1,i+1} =$ " in (9) should read -- $a_{i,i+1} =$ --.
6. Column 8, line 14, "For" should read --(iii) For--.
7. Column 8, line 23, "Set" should read --(iv) Set--.
8. Column 11, lines 9-14, all " $\cdot \cdot$ " in matrix A of (26) should read -- $\ddots$ --.
9. Column 11, line 33, " $\frac{-1}{C_n(R_s + R_n)}$ " should read -- $\frac{-1}{C_n(R_s + R_n)}$ --.
10. Column 13, lines 29-30, " $\cdot \cdot$ " in matrix A of (35) should read -- $\ddots$ --.
11. Column 15, lines 7-8, " $\cdot \cdot$ " in matrix A of (45) should read -- $\ddots$ --.
12. Column 16, line 63, " $\cdot \cdot$ " in matrix A of (55) should read -- $\ddots$ --.
13. Column 21, line 30, "If" should read --(iv) If--.
14. Column 25, line 39, " $\cdot \cdot$ " in matrix A should read -- $\ddots$ --.
15. Column 28, line 63, " $\cdot \cdot$ " in matrix A should read -- $\ddots$ --.
16. Column 35, line 4, " $i\, 1,\cdots,n$ " in claim 12 should read -- $i = 1,\cdots,n$ --.
17. Column 36, line 44, " $D_n, (s)$ " in claim 16 should read -- $D_n(s)$ --.
18. Column 37, line 33, "for $n = 2$, then" in claim 17 should read --if $n = 2$, then--.
19. Column 37, line 37, "for $n > 2$, then" in claim 17 should read --if $n > 2$, then--.
20. Column 37, line 47, "1 st" in claim 18 should read --1st--.
21. Column 38, line 37, "[s + ..." should read -- = [s + ... --.

Signed and Sealed this

Twenty-seventh Day of February, 2007

JON W. DUDAS  
*Director of the United States Patent and Trademark Office*